(12) United States Patent
Swire et al.

(10) Patent No.: US 11,488,888 B2
(45) Date of Patent: *Nov. 1, 2022

(54) CHEMICAL VAPOR DEPOSITION DIAMOND (CVDD) WIRES FOR THERMAL TRANSPORT

(71) Applicant: Microchip Technology Caldicot Limited, Caldicot (GB)

(72) Inventors: Philip Andrew Swire, Chepstow (GB); Nina Biddle, Coleford (GB)

(73) Assignee: MICROCHIP TECHNOLOGY CALDICOT LIMITED, Caldicot (GB)

( * ) Notice: Subject to any disclaimer, the term of this patent is extended or adjusted under 35 U.S.C. 154(b) by 387 days.

This patent is subject to a terminal disclaimer.

(21) Appl. No.: 16/726,747

(22) Filed: Dec. 24, 2019

(65) Prior Publication Data

US 2021/0143080 A1    May 13, 2021

Related U.S. Application Data

(60) Provisional application No. 62/933,333, filed on Nov. 8, 2019.

(51) Int. Cl.
*H01L 23/34* (2006.01)
*H01L 23/373* (2006.01)
(Continued)

(52) U.S. Cl.
CPC .......... *H01L 23/3732* (2013.01); *C23C 16/27* (2013.01); *H01L 23/3677* (2013.01);
(Continued)

(58) Field of Classification Search
CPC ............. H01L 23/3732; H01L 23/3677; H01L 23/49816; H01L 23/373; H05K 1/0209; H05K 1/145; H05K 3/3485; H05K 3/368; H05K 1/181; H05K 3/249; H05K 2201/09072; H05K 2201/09772;
(Continued)

(56) References Cited

U.S. PATENT DOCUMENTS 5,388,027 A    2/1995  Pollock et al.
11,189,543 B2 * 11/2021  Swire ...................... H01L 24/73
(Continued)

OTHER PUBLICATIONS

PCT/GB20/50562, International Search Report and Written Opinion, European Patent Office, dated Aug. 14, 2020.
(Continued)

*Primary Examiner* — Theresa T Doan
(74) *Attorney, Agent, or Firm* — Glass and Associates; Kenneth Glass

(57) ABSTRACT

A method and apparatus for conducting heat away from a semiconductor die are disclosed. A board assembly is disclosed that includes a circuit board, a semiconductor die electrically coupled to the circuit board and a Chemical Vapor Deposition Diamond (CVDD) coated wire. A portion of the CVDD-coated wire extends between a hot-spot on the semiconductor die and the circuit board. The board assembly includes a layer of thermally conductive paste that is disposed between the hot-spot on the semiconductor die and the circuit board. The layer of thermally conductive paste is in direct contact with a portion of the CVDD-coated wire.

20 Claims, 22 Drawing Sheets

(51) Int. Cl.
    *H01L 23/498*     (2006.01)
    *H01L 23/367*     (2006.01)
    *H05K 1/02*     (2006.01)
    *H05K 1/14*     (2006.01)
    *H05K 3/36*     (2006.01)
    *C23C 16/27*     (2006.01)
    *H05K 3/34*     (2006.01)

(52) U.S. Cl.
    CPC ..... *H01L 23/49816* (2013.01); *H05K 1/0209* (2013.01); *H05K 1/145* (2013.01); *H05K 3/3485* (2020.08); *H05K 3/368* (2013.01)

(58) Field of Classification Search
    CPC .. H05K 2201/09781; H05K 2203/1338; C23C 16/27
    USPC ........................................................ 257/721
    See application file for complete search history.

(56) References Cited

U.S. PATENT DOCUMENTS

| | | |
|---|---|---|
| 2003/0231471 A1 | 12/2003 | Lorenzo et al. |
| 2010/0140790 A1 | 6/2010 | Setiadi et al. |
| 2011/0192027 A1 | 8/2011 | Campbell et al. |
| 2014/0027294 A1 | 1/2014 | Sumant et al. |

OTHER PUBLICATIONS

G. Chollon et al., "High temperature properties of SiC and diamond CVD-monofilaments," Journal of the European Ceramic Society 25, Elsevier B.V., Sep. 1, 2004.

P.W. May et al., "Thermal conductivity of CVD diamond fibres and diamond fibre-reinforced epoxy composites," Diamond & Related Materials 14 (2005) 598-603, Elsevier B.V., Nov. 30, 2004.

* cited by examiner

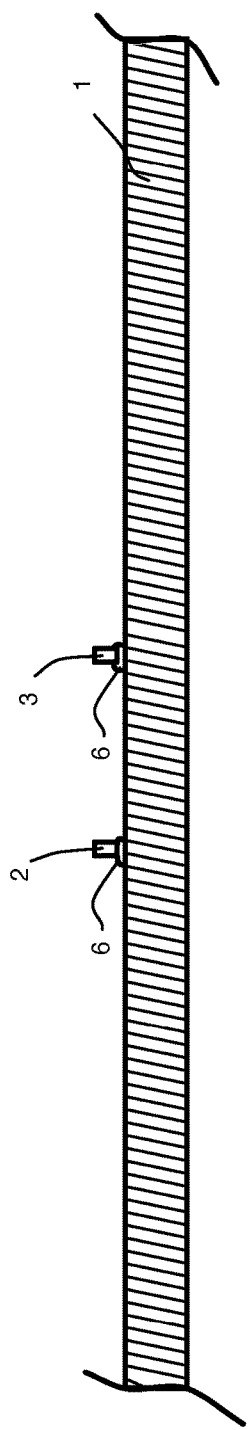
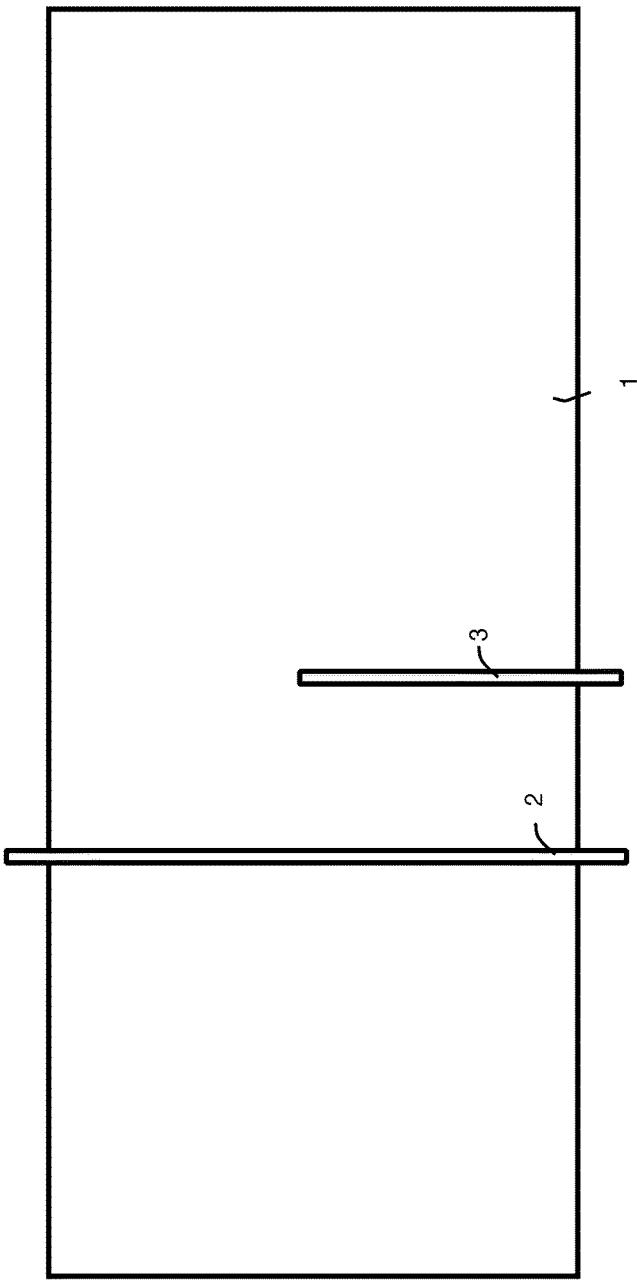

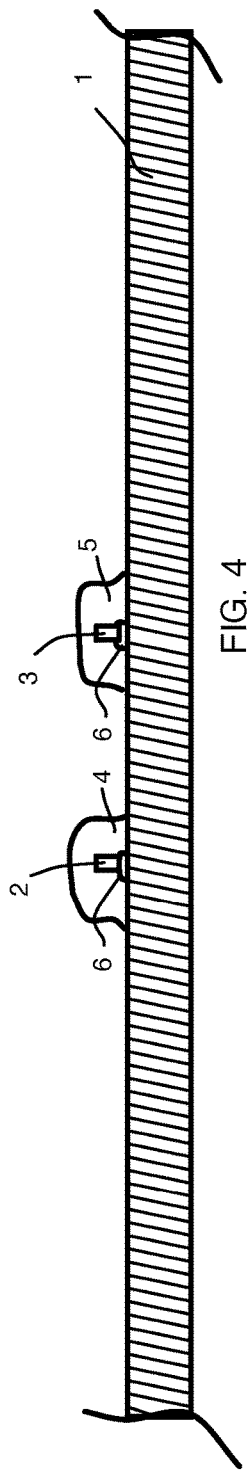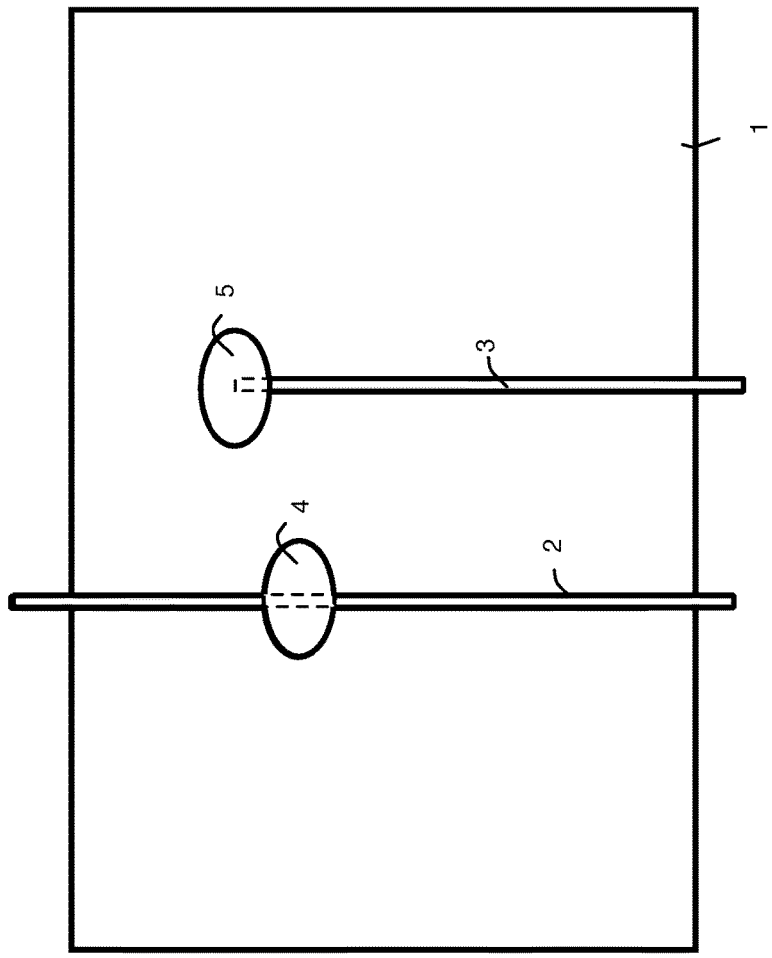

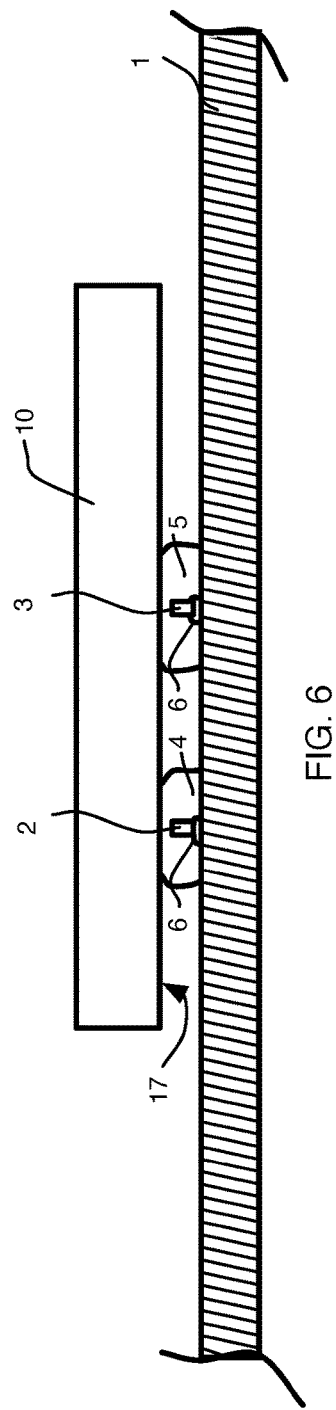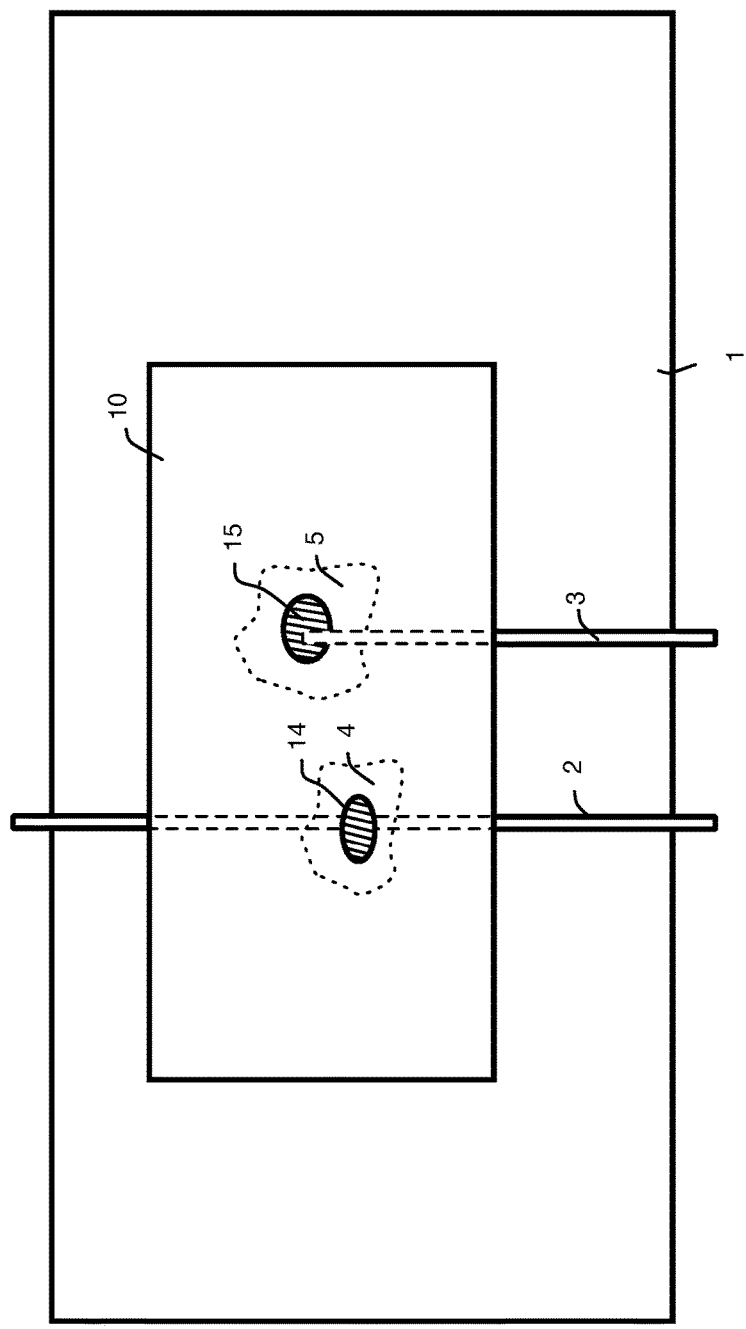

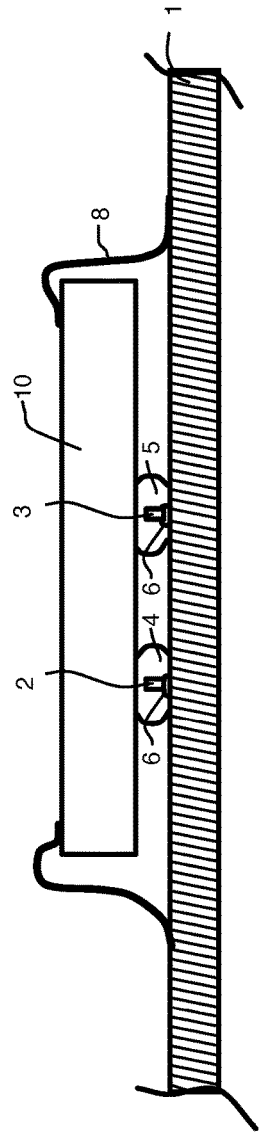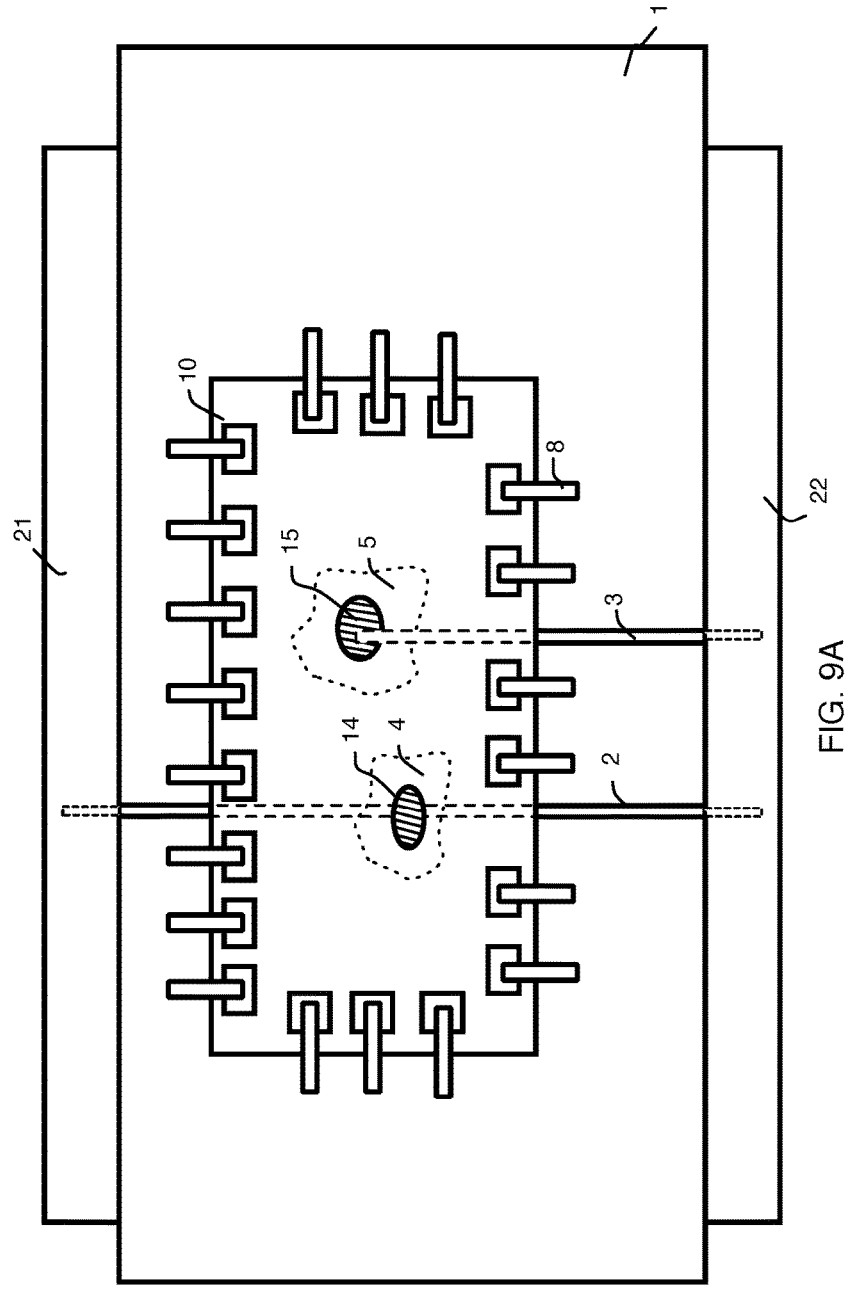

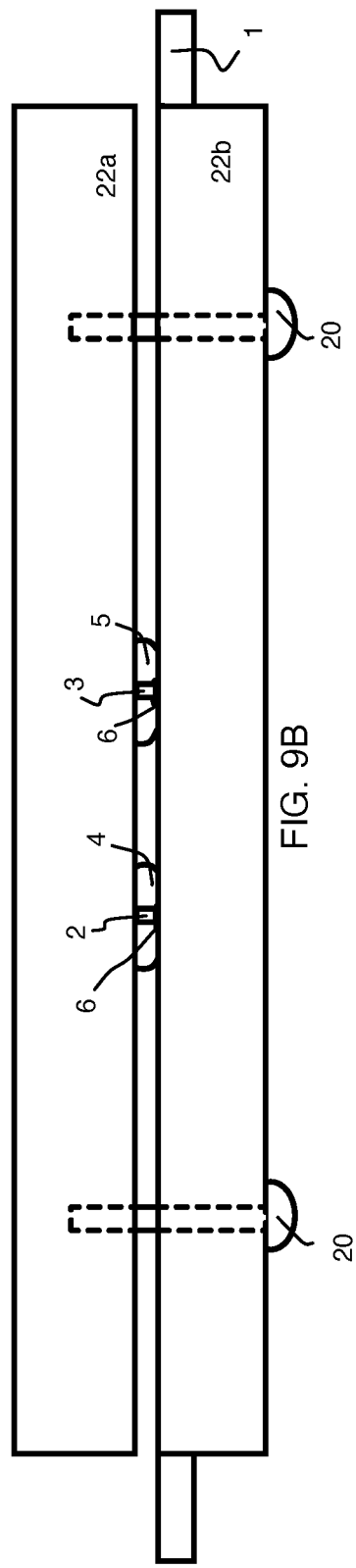

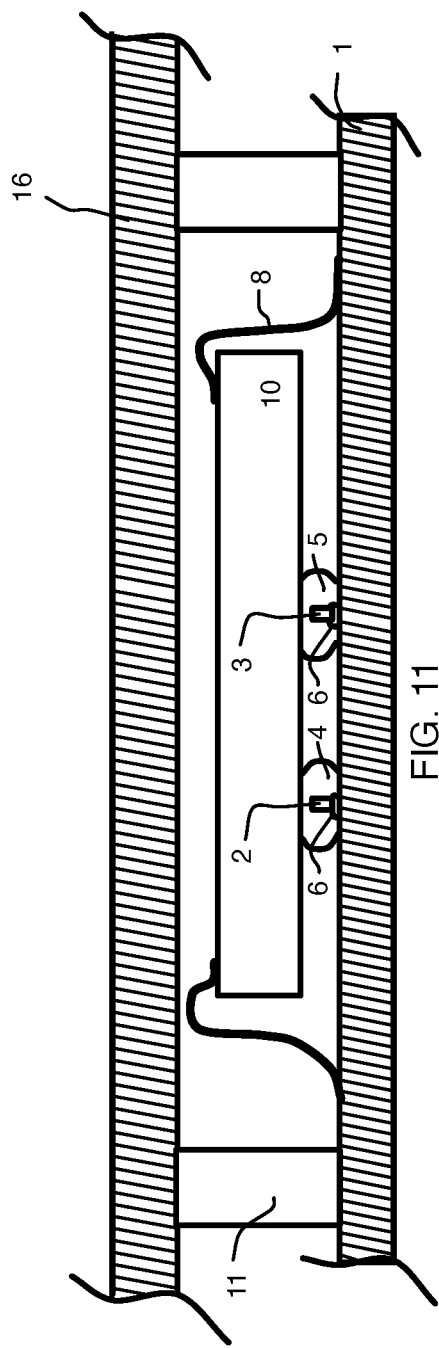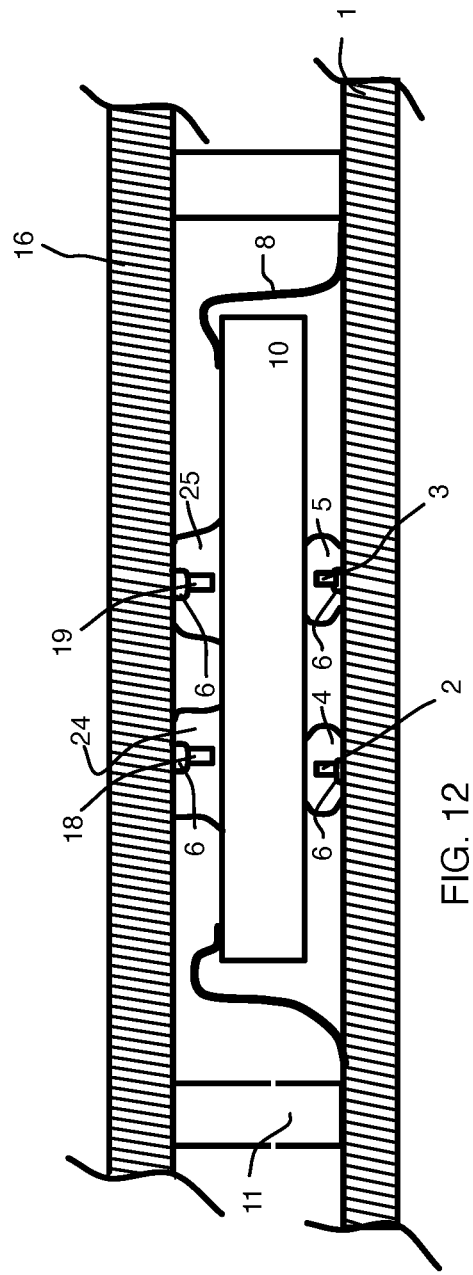

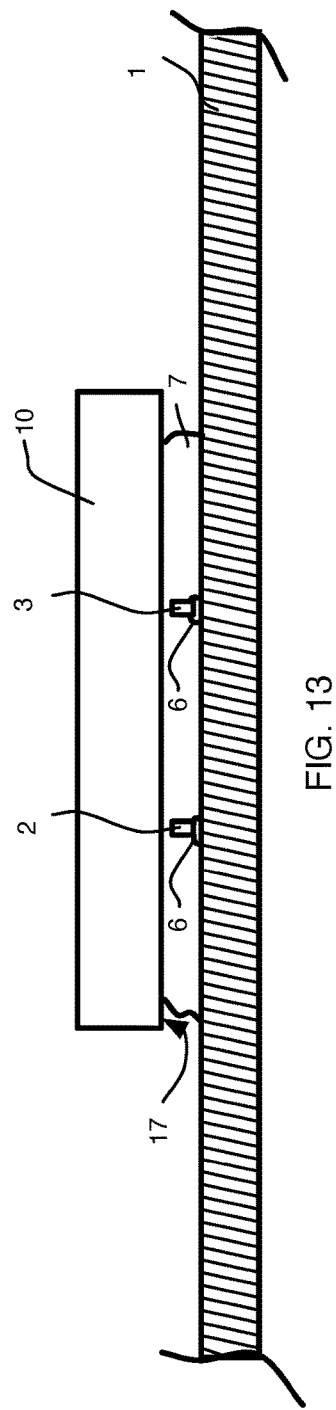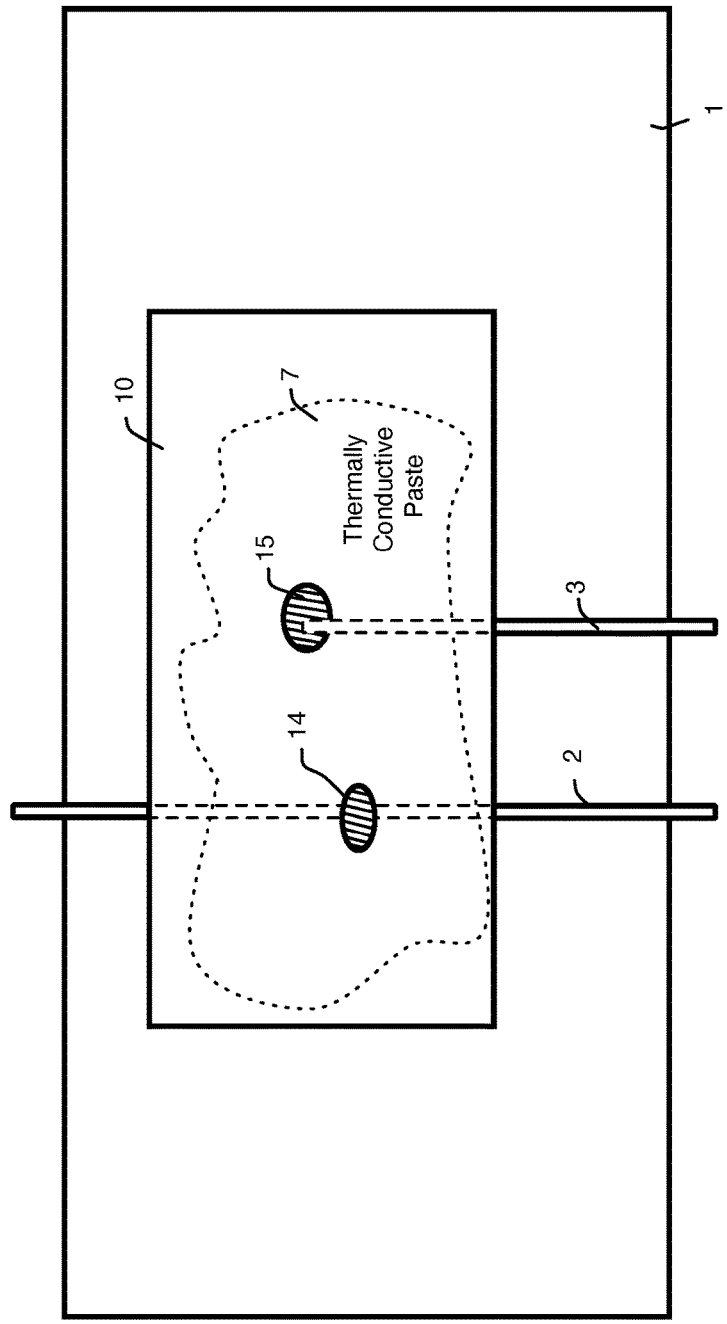

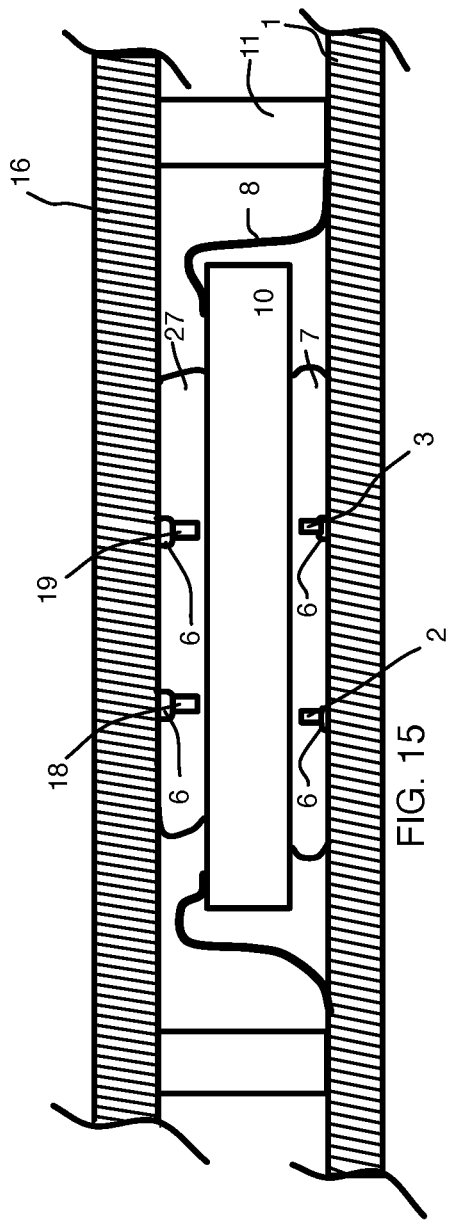

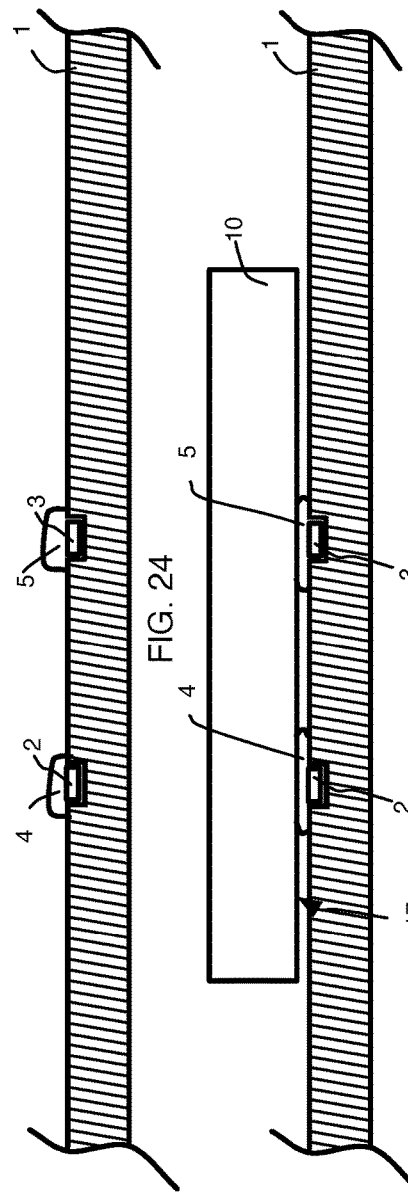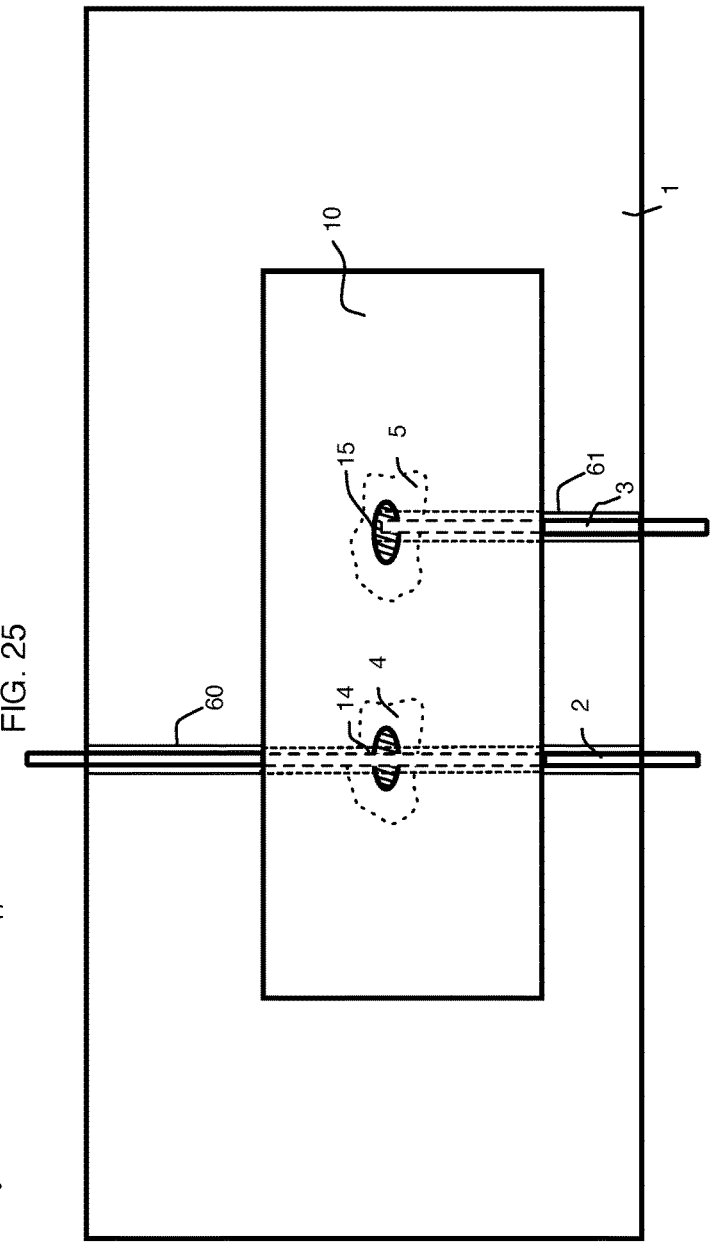

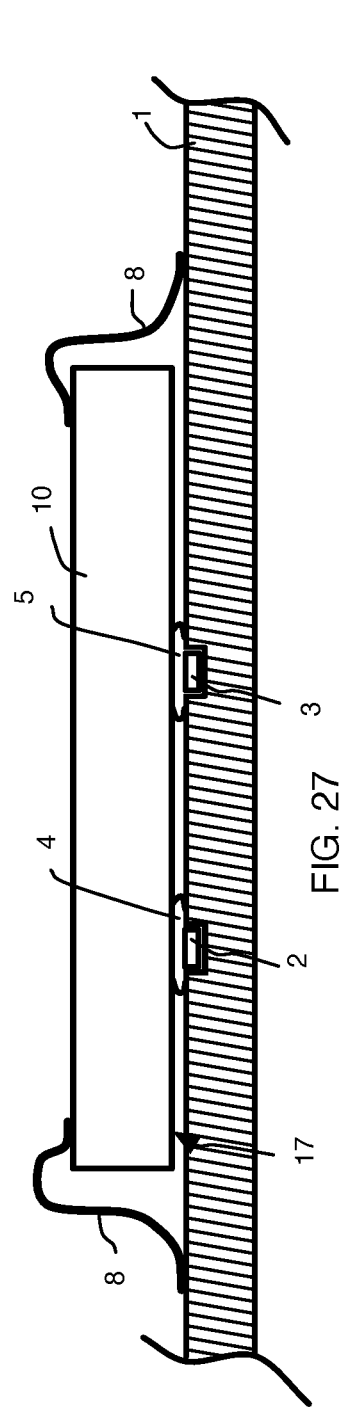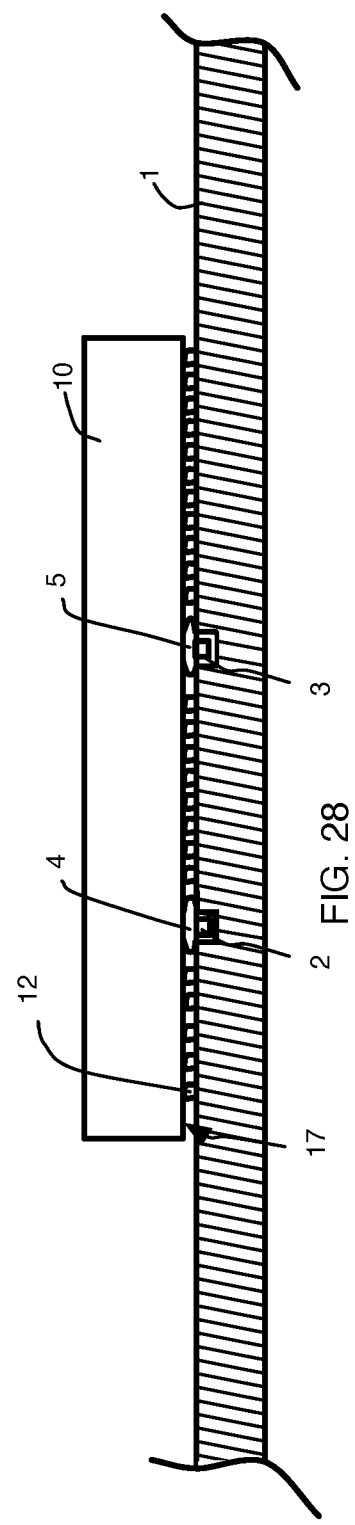

US 11,488,888 B2

CHEMICAL VAPOR DEPOSITION DIAMOND (CVDD) WIRES FOR THERMAL TRANSPORT

BACKGROUND

Semiconductor die require effective thermal transport to prevent heat buildup that can impair performance of the die and permanently damage the die. Various mechanisms have been used in the past to remove heat from die. The most common mechanism is the use of metallic fins that attach to the top of the die via thermally conductive adhesive. This has worked well in the past for single-board designs. However, with multi-board assemblies in which die are placed between two boards, there is no way to place metallic fins directly over the die.

Diamond has the highest known thermal conductivity of any material at room temperature. Chemical Vapor Deposition Diamond (CVDD) has been used to form sheets of CVDD that are less expensive than natural diamonds. Pastes and gels made up of CVDD grains have been used in a number of different manufacturing processes because of their high thermal conductivity. CVDD-coating process have been developed that allow for coating of materials with a thin layer of CVDD.

There is a need for a method and apparatus at reduced cost that will provide sufficient thermal transport so as to prevent heat buildup within individual die. Also, there is a need for a method and apparatus that can be used to convey heat away from die that can be used in multi-board assemblies.

BRIEF DESCRIPTION

A method for forming a board assembly is disclosed that includes identifying a location of a hot-spot on the semiconductor die; attaching a first CVDD-coated wire to a circuit board in a location corresponding to the location of the identified hot-spot; applying a layer of thermally conductive paste over the first CVDD-coated wire; and placing the semiconductor die over the layer of thermally conductive paste. A surface of the semiconductor die is in direct contact with the layer of thermally conductive paste and a portion of the first CVDD-coated wire extends between the identified location of a hot-spot on the semiconductor die and the first circuit board.

A board assembly is disclosed that includes a circuit board, a semiconductor die electrically coupled to the circuit board and a CVDD-coated wire. A portion of the CVDD-coated wire extends between a hot-spot on the semiconductor die and the circuit board. The board assembly includes a layer of thermally conductive paste that is disposed between the hot-spot on the semiconductor die and the circuit board. The layer of thermally conductive paste is in direct contact with a portion of the CVDD-coated wire. The CVDD-coated wire is thermally coupled to one or more heat sink.

Because of the high thermal conductivity of the CVDD-coated wire and the thermally conductive paste, and the positioning of the CVDD-coated wire and thermally conductive paste beneath hot-spots, heat is quickly and effectively removed from the die. Also, the method and apparatus of the present invention may be used in multi-board assemblies, allowing for effective heat removal from multi-board assemblies.

BRIEF DESCRIPTION OF THE DRAWING FIGURES

The invention will be explained in more detail in the following with reference to embodiments and to the drawing in which are shown. It is appreciated that the drawings are not drawn to scale.

FIG. 2 is a diagram showing a front side cross-sectional view of a circuit board after CVDD-coated wires have been attached to the circuit board in accordance with an example of the invention.

FIG. 3 is a diagram showing a top view of the circuit board of FIG. 2 in accordance with an example of the invention.

FIG. 4 is a diagram showing front cross-sectional view of the circuit board assembly of FIG. 3 after a layer of thermally conductive paste has been deposited over a portion of each CVDD-coated wire in accordance with an example of the invention.

FIG. 5 is a diagram showing a top view of the circuit board assembly of FIG. 4 in accordance with an example of the invention.

FIG. 6 is a diagram showing a front cross-sectional view of the circuit board assembly of FIG. 5 after a semiconductor die has been placed over the layer of thermally conductive paste, in accordance with an example of the invention.

FIG. 7 is a diagram showing a top view of the circuit board assembly of FIG. 6 in accordance with an example of the invention.

FIG. 8 is a diagram showing a front cross-sectional view of the circuit board assembly of FIG. 7 after leads have been attached to the die and to the circuit board in accordance with an example of the invention.

FIG. 9A is a diagram showing a top view of the circuit board assembly of FIG. 8 after heat sinks are thermally coupled to each CVDD-coated wire in accordance with an example of the invention.

FIG. 9B is a diagram showing a front view of the circuit board assembly of FIG. 9A in accordance with an example of the invention.

FIG. 11 is a diagram showing a front side cross-sectional view of a circuit board assembly that includes two circuit boards and in which leads are used to couple the semiconductor die to the circuit board, in accordance with an example of the invention.

FIG. 12 is a diagram showing a front cross-sectional view of a circuit board assembly that includes two circuit boards and in which CVDD-coated wires are attached to both of the circuit boards such that CVDD-coated wires extend both above the semiconductor die and below the semiconductor die, in accordance with an example of the invention.

FIG. 13 is a diagram showing a front cross-sectional view of a circuit board assembly in which thermally conductive paste is distributed so that the layer of thermally conductive paste is a single region of thermally conductive paste that extends beneath the entire lateral area of each of the identified hot-spots in accordance with an example of the invention.

FIG. 14 is a top view of the structure of FIG. 13 in accordance with an example of the invention.

FIG. 15 is a diagram showing a front cross-sectional view of a circuit board assembly that includes two circuit boards and in which CVDD-coated wires extend both above the semiconductor die and below the semiconductor die, in accordance with an example of the invention.

FIG. 24 is a diagram showing a front cross-sectional view of the circuit board assembly of FIG. 23 after a layer of thermally conductive paste has been deposited over each CVDD-coated wire in accordance with an example of the invention.

FIG. 25 is a diagram showing a top view of the circuit board assembly of FIG. 24 after a semiconductor die has been placed over the layer of thermally conductive paste, in accordance with an example of the invention.

FIG. 26 is a diagram showing a top view of the circuit board assembly of FIG. 25 in accordance with an example of the invention.

FIG. 27 is a diagram showing a front cross-sectional view of the circuit board assembly of FIG. 26 after leads have been attached to the die and to the circuit board in accordance with an example of the invention.

FIG. 28 is a diagram showing a front cross-sectional view of the circuit board assembly of FIG. 26 after a ball grid array has attached the die to the circuit board in accordance with an example of the invention.

DETAILED DESCRIPTION

Persons of ordinary skill in the art will realize that the following description is illustrative only and not in any way limiting. Other examples will readily suggest themselves to such skilled persons.

Figure 1:
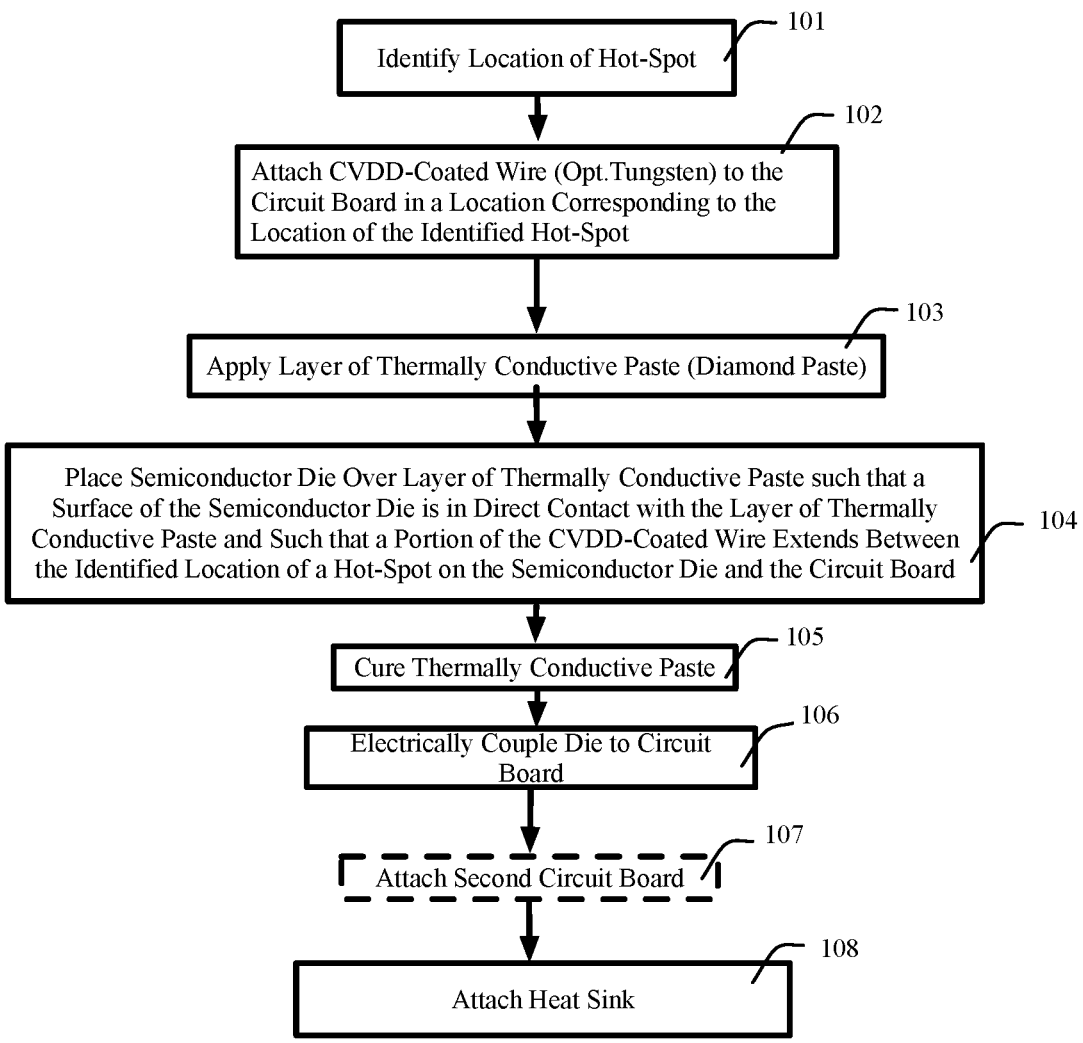
FIG. 1 is a block diagram illustrating a method for forming a board assembly having CVDD-coated wires for heat removal in accordance with an example of the invention.

FIG. 1 shows a method 100 for forming a board assembly having CVDD-coated wires for conducting heat away from hot-spots on a semiconductor die. A location of a hot-spot on a semiconductor die is identified (101). The location of one or more hot-spot may be determined by analyzing the thermal properties of a plurality of test semiconductor die to identify the location of hot-spots on the test semiconductor die. Hot spots may be identified using a thermal camera image of the surface of the test semiconductor die when the test semiconductor die are operating in a nominal manner (or in a conventional test mode) to accurately identify the position of the hot-spots. These locations are then accurately mapped. The term "hot-spot," as used in the present application, is a small area within a die that has an elevated heat output compared to the surrounding area of that die. In one example, areas having a temperature of more than ten percent above the surrounding area of the die, or more than ten percent above an average temperature of the surface of the die are determined to be hot-spots.

The test semiconductor die used to identify the hot-spots will preferably have the same design and manufacture as the semiconductor die used in the board assembly so that the position of the hot-spots are accurately determined.

A CVDD-coated wire is attached (102) to a circuit board in a location corresponding to the location of the identified hot-spot. Step 102 may be performed by dispensing adhesive; placing the CVDD-coated wire in a location corresponding to the location of the identified hot-spot; and curing the adhesive. In the example shown in FIGS. 2-3, CVDD-coated wires 2, 3 are attached to circuit board 1 using adhesive 6. A pick-and-place device may be used to precisely position the CVDD-coated wires 2, 3. Adhesive 6 may either be dispensed on the CVDD-coated wire 2, 3 prior to placement of the CVDD-coated wire 2, 3 on circuit board 1, or may be dispensed on circuit board 1 (e.g., along the entire length of the area of the circuit board 1 that will underlie a CVDD-coated wire 2, 3 or a portion thereof). The circuit board may be a conventional copper-clad circuit board.

The CVDD-coated wire 2, 3 is initially formed by placing a 'seed' wire in a CVDD oven at 900° C. The chemical vapor of diamond is then laid down on this 'seed' wire over a period of time. Generally, the wire chosen is either Tungsten or Molybdenum (though other elements can be used) as they form carbides which allows the CVDD to bond to the wire. The CVDD is 'grown' onto the wire (approximately 0.5 µm/hour) to form an even coating along its length. The thickness of the diamond coating is nominally up to half the diameter of the 'seed' wire.

In one example, the CVDD-coated wire is formed by inserting a tungsten wire in to a heated CVDD oven so as to form a tungsten carbide surface, followed by chemical vapor deposition of diamond material such that the diamond bonds with the tungsten carbide surface.

The CVDD-coated wire 2, 3 maintains the thermal conductive properties of diamond. In one example the CVDD-coated wire is from 25-250 µm in width or diameter.

A layer of thermally conductive paste is applied (103) over the CVDD-coated wire. The thermally conductive paste may be a diamond paste. In one specific example, more than ninety percent of the layer of thermally conductive paste is constituted of CVDD particles having a size of less than 0.5 microns, and the remaining portion of the thermally conductive paste is a thermally conductive material (e.g., a glue, gel or grease).

In a second example, the thermally conductive paste may be diamond paste with a CVDD loading of 70-90%, with CVDD grains having a size of 0.5-1 µm supported in organic resin and solvent.

In the example shown in FIGS. 4-5 a layer of thermally conductive paste less than 40 µm thick is applied over each CVDD-coated wire 2, 3 at the location of each identified hot-spot, shown as regions of thermally conductive paste 4, 5. In this example, when the thermally conductive paste is diamond paste, the layer of thermally conductive paste 4, 5 is only applied over those portions of each CVDD-coated wire 2, 3 where the wire passes through or extends within an identified location of a hot-spot; thereby conserving the relatively-expensive diamond paste while providing sufficient thermal conductivity to effectively conduct heat away from the identified hot spot(s).

The semiconductor die is placed (104) over the layer of thermally conductive paste such that a surface of the semiconductor die is in direct contact with the layer of thermally conductive paste and such that a portion of the CVDD-coated wire extends between the identified location of a hot-spot on the semiconductor die and the circuit board.

In the example shown in FIGS. 6-7 a semiconductor die 10 may be pressed against the layer of thermally conductive paste 4, 5 such that the layer of thermally conductive paste 4, 5 expands laterally and thus has reduced thickness as compared to the layer as applied in step 102.

In the example shown in FIGS. 6-7, and as discussed above, the analysis of step 101 is performed on a test semiconductor die having the same design as semiconductor die 10 to identify hot-spots at locations on the test semiconductor die corresponding to locations 14-15 on die 10. In the following examples and discussion, locations 14-15 are referred to as hot-spots on semiconductor die 10. However, it is appreciated that the process of identifying the location of hot-spots 14-15 will be done on a test die (not shown) prior to the assembly process, and not determined using the semiconductor die 10 that will be used in the assembly process.

In the board assembly of FIGS. 6-7 a portion of each CVDD-coated wire 2, 3 extends between a hot-spot on the bottom surface 17 of semiconductor die 10 and circuit board 1 and the layer of thermally conductive paste 4, 5 is in direct contact with a portion of each CVDD-coated wire 2, 3 and with the bottom surface 17 of semiconductor die 10. More particularly, a portion of CVDD-coated wire 2 extends between hot-spot 14 and circuit board 1. Region of thermally conductive paste 4 is in direct contact with a portion of CVDD-coated wire 2 and the bottom surface 17 of semiconductor die 10, and extends under the entire lateral area of hot-spot 14, between the bottom surface 17 of semiconductor die 10 and circuit board 1. Similarly, a portion of CVDD-coated wire 3 extends between hot-spot 15 and circuit board 1. Region of thermally conductive paste 5 is in direct contact with a portion of CVDD-coated wire 3 and the bottom surface 17 of semiconductor die 10, and extends under the entire lateral area of hot-spot 15, between the bottom surface 17 of semiconductor die 10 and circuit board 1.

Optionally, the thermally conductive paste is cured (105). In one example the thermally conductive paste includes CVDD diamond particles suspended in adhesive heat-cured, thixtropic low viscosity epoxy casting resin such as Delo Monopox (e.g., GE725). In this example, the curing process may include heating the circuit board assembly at 165° C. for 60 minutes.

The die is electrically coupled (106) to the circuit board. In one example, that is illustrated in FIG. 8, leads 8 are attached to semiconductor die 10 and circuit board 1 to electrically couple the semiconductor die 10 to circuit board 1.

Referring now to step 108, one or more heat sink is coupled (e.g., attached), to the CVDD-coated wire. In the example shown in FIG. 9A, two heat sinks are attached to the CVDD-coated wire. More particularly, a first heat sink 21 is on one side of the board assembly and a second heat sink 22 is on the opposite side of the board assembly, with each CVDD-coated wire 2, 3 thermally coupled on one or more end to a respective heat sink 21, 22.

In one example that is illustrated in FIG. 9A one or more end of each CVDD-coated wire 2-3 extends past the edge of the circuit board 1 and each heat sink 21, 22 directly contacts the portion of each CVDD-coated wire 2, 3 that extends past the edge of the circuit board 1 for conducting heat away from circuit board 1. In this example, CVDD-coated wire 2 extends across semiconductor die 10, completely through the lateral extent of the thermally conductive paste 4 underlying hot-spot 14 and protrudes from opposite edges of circuit board 1. CVDD-coated wire 3 extends from an area underlying hot-spot 15 through the lateral extent of the thermally conductive paste 5 and protrudes from an edge of circuit board 1.

In the example shown in FIG. 9A-9B, heat sinks 21-22 do not overlap circuit board 1 and extend outside of the edges of circuit board 1, with some or all of that portion of each CVDD-coated wire 2, 3 that extends past the edges of circuit board 1 in direct contact with the respective heat sink 21, 22. More particularly, a portion of CVDD-coated wire 2 proximate one end of CVDD-coated wire 2 is in direct contact with heat sink 21 and a portion of CVDD-coated wire 2 proximate the other end of CVDD-coated wire 2 is in direct contact with heat sink 22. Similarly, a portion of CVDD-coated wire 3 proximate one end of CVDD-coated wire 3 is in direct contact with thermally conductive paste 5 and a portion of CVDD-coated wire 3 proximate the other end of CVDD-coated wire 3 is in direct contact with heat sink 22.

Referring to FIG. 9B, heat sink 22 includes a top plate 22a and a bottom plate 22b that are attached together by screws 20. Screws 20 couple top plate 22a and bottom plate 22b together such that CVDD-coated wires 2, 3 directly contact both the top plate 22*a* and the bottom plate 22*b* for thermally coupling CVDD-coated wires 2, 3 to heat sink 22.

Figure 10:
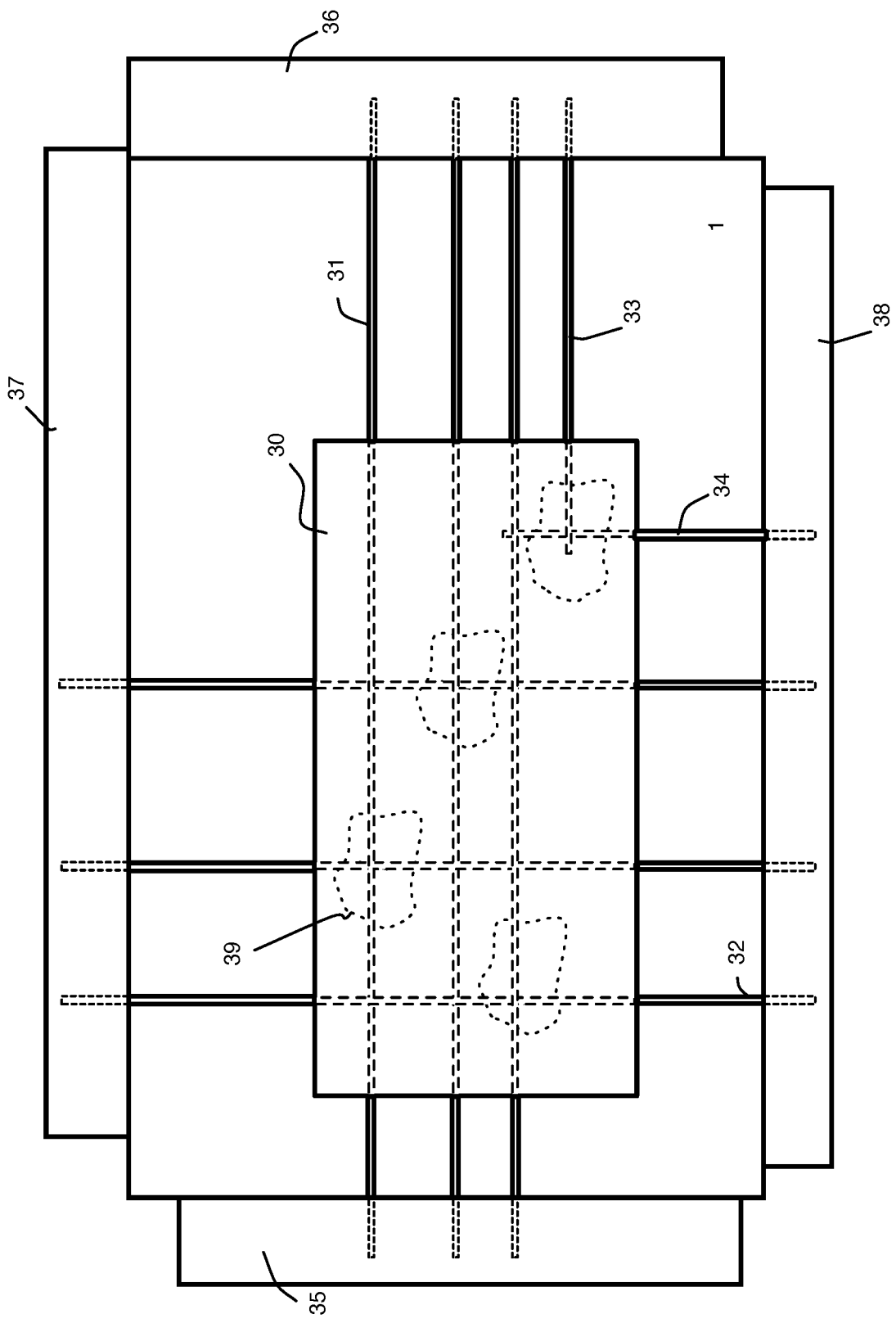
FIG. 10 is a diagram showing a top view of a circuit board assembly in which CVDD-coated wires cross each other in accordance with an example of the invention.

In the example shown in FIG. 10, in step 102 of FIG. 1, CVDD-coated wires 31-34 are attached to circuit board 1. CVDD-coated wires 31-34 extend through regions of thermally conductive paste 39, with each region of thermally conductive paste 39 underlying one or more hot-spot on semiconductor die 30. Each horizontally oriented CVDD-coated wire 31, 33 crosses a corresponding vertically-oriented CVDD-coated wire 32, 34 within a region of thermally conductive paste 39. In this example, a portion of CVDD-coated wire 33, at or near one end of CVDD-coated wire 33 extends between the location of a hot spot on semiconductor die 10 and circuit board 1 and the other end of CVDD-coated wire 33 is thermally coupled to a heat sink 36 (e.g., a portion of CVDD-coated wire 33 proximate one end of CVDD-coated wire 33 is in direct contact with heat sink 36). Similarly, a portion of CVDD-coated wire 34, at or near one end of CVDD-coated wire 34 extends between the location of a hot spot on semiconductor die 10 and circuit board 1 and a portion of CVDD-coated wire 34, at or near the other end of CVDD-coated wire 34, is thermally coupled to a heat sink 38.

Both ends of each CVDD-coated wire 32 are thermally coupled to a heat sink 37, 38. More particularly, a portion of CVDD-coated wire 32 proximate one end of CVDD-coated wire 32 is in direct contact with a heat sink 37 and a portion of CVDD-coated wire 32 proximate the other end of CVDD-coated wire 32 is in direct contact with a heat sink 38. Similarly, a portion of CVDD-coated wire 31 proximate one end of CVDD-coated wire 31 is in direct contact with heat sink 35 and a portion of CVDD-coated wire 31 proximate the other end of CVDD-coated wire 31 is in direct contact with a heat sink 36.

When a mesh of crossing wires is to be used, (e.g., a number of crossing wires as is illustrated in FIG. 10) a spot weld process could be performed to weld the junctions prior to CVDD coating. In one example, wires 32, 34 are straight and wires 31, 33 are shaped so that they include an inverted "u" shape where they respectively cross over wires 32, 34. The junctions could also be glued or plated together. Shaping and joining processes are performed before coating the wire with CVDD.

The methods of steps 101-106 and 108 may be applied to form multi-board assemblies. Referring now to step 107, to form a multi-board assembly, a second circuit board is attached to the first circuit board 1. In FIG. 11, an exemplary multi-board assembly is shown that includes a second circuit board 16 that is coupled to circuit board 1 by standoff structures 11, such that semiconductor die 10 extends between circuit board 1 and circuit board 16.

Some or all of steps 101-106 may be performed on each circuit board of the multi-board assembly. In one example that is illustrated in FIG. 12, steps 102-103 are performed on circuit board 16 prior to attaching circuit board 16 to circuit board 1 (e.g., by attaching CVDD-coated wires to circuit board 16 in a location corresponding to the location of the identified hot-spot(s) in the same manner as illustrated in FIGS. 1-10). In this example, adhesive 6 is dispensed on circuit board 16 and CVDD-coated wires 18, 19 are placed in a location corresponding to the location of the identified hot-spots and circuit board 16 is flipped over and precisely aligned with circuit board 1 such that a portion of each CVDD-coated wire 18, 19 extends between a hot spot on the top surface of semiconductor die 10 and circuit board 16. Accordingly, in the board assembly of FIG. 12 a portion of each CVDD-coated wire 18, 19 extends between a hot-spot on the top surface of semiconductor die 10 and circuit board 16 and the layer of thermally conductive paste is in direct contact with a portion of each CVDD-coated wire 18, 19 and the top surface of semiconductor die 10. More particularly, a portion of CVDD-coated wire 18 extends between hot-spot 14 (not shown) and circuit board 16. Region of thermally conductive paste 24 is in direct contact with a portion of CVDD-coated wire 18 and the top surface of semiconductor die 10, and extends over the entire lateral area of hot-spot 14, between the top surface of semiconductor die 10 and circuit board 16. Similarly, a portion of CVDD-coated wire 19 extends between hot-spot 15 (not shown) and circuit board 16. Region of thermally conductive paste 25 is in direct contact with a portion of CVDD-coated wire 19 and the top surface of semiconductor die 10, and extends over the entire lateral area of hot-spot 15, between the top surface of semiconductor die 10 and circuit board 16.

In the board assembly of FIGS. 13-14, layer of thermally conductive paste 7 forms a single region of thermally conductive past that extends between more than one hot-spot 14, 15 and circuit board 1. In this example, layer of thermally conductive paste 7 extends broadly under semiconductor die 10, underlying some or all of semiconductor die 10. Layer of thermally conductive paste 7 extends under the entire lateral area of each hot-spot 14, 15, between each hot-spot 14, 15 on the bottom surface 17 of semiconductor die 10 and circuit board 1, and is in direct contact with a portion of each CVDD-coated wire 2, 3 and with the bottom surface 17 of semiconductor die 10. In one example, the semiconductor die 10 is pressed against the layer of thermally conductive paste 7 such that the layer of thermally conductive paste 7 fills any voids and excludes any air between bottom surface 17 of semiconductor die 10 and circuit board 1.

Multi-board assemblies may also include the more extensive layer of thermally conductive paste described above in relation to FIGS. 13-14. This is illustrated in FIG. 15 that shows a layer of thermally conductive paste 27 that is in direct contact with a portion of each CVDD-coated wire 18, 19 and with the top surface of semiconductor die 10. In this example, layer of thermally conductive paste 27 extends between each hot-spot 14, 15 (not shown) on the top surface of semiconductor die 10 and circuit board 16, and further extends above the entire lateral area of each hot-spot 14, 15.

Figure 16:
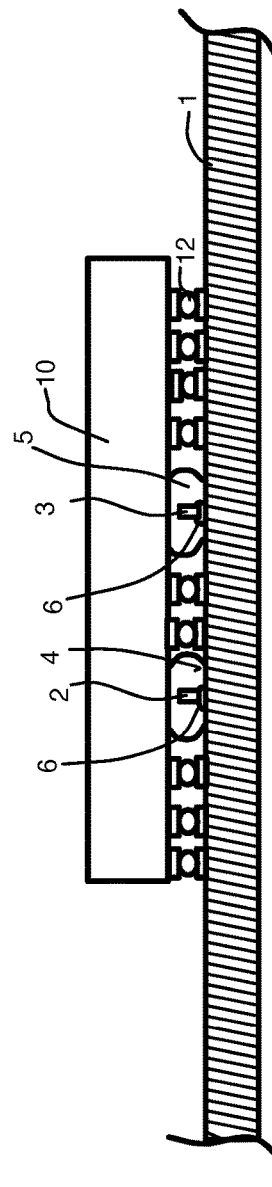
FIG. 16 is a diagram showing a front cross-sectional view of a circuit board assembly that includes a ball grid array for electrically coupling the semiconductor die to the circuit board in accordance with an example of the invention.
Figure 17:
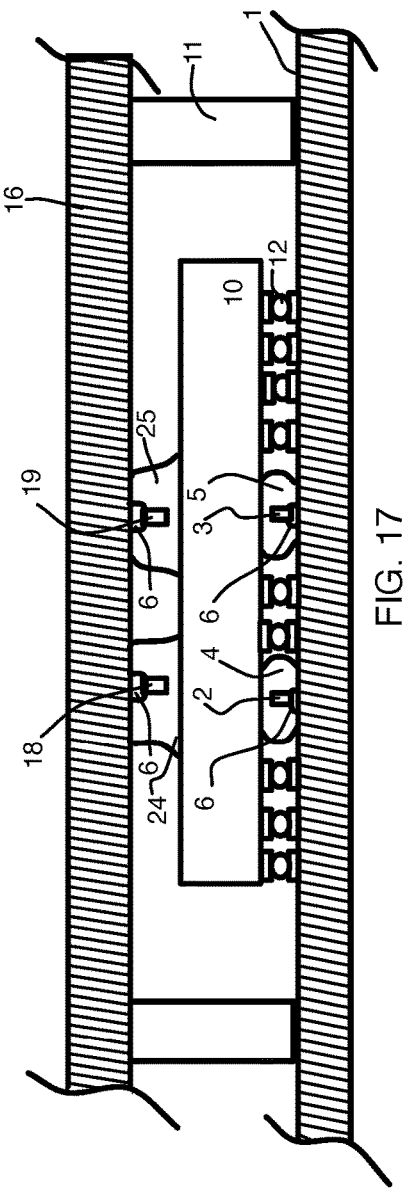
FIG. 17 is a diagram showing a front cross-sectional view of a circuit board assembly that includes two circuit boards and in which a ball grid array is used to couple the semiconductor die to the circuit board, in accordance with an example of the invention.
Figure 18:
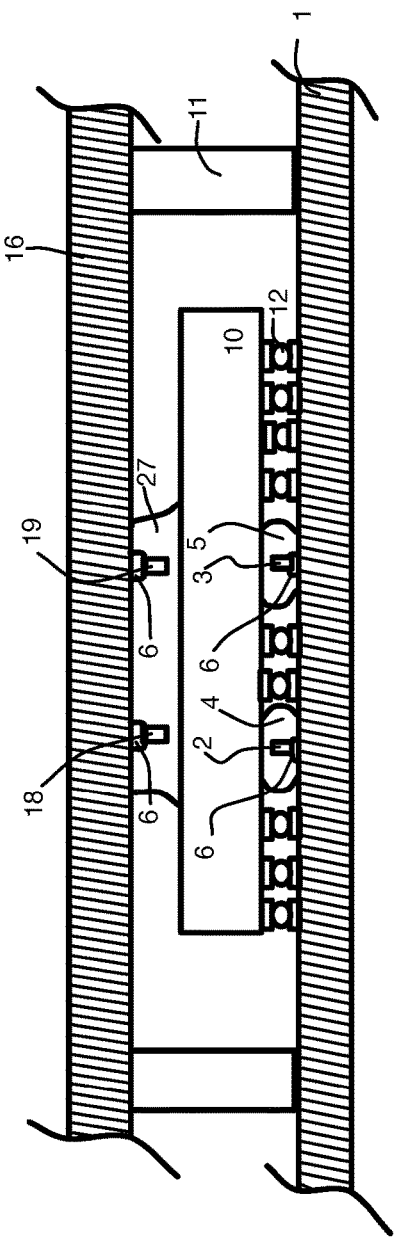
FIG. 18 is a diagram showing a front cross-sectional view of a circuit board assembly that includes two circuit boards and in which a ball grid array is used to couple the semiconductor die to the circuit board, in accordance with an example of the invention.

In the example shown in FIGS. 16-18, in step 106 of FIG. 1, semiconductor die 10 is coupled (both mechanically and electrically) to circuit board 1 using a ball grid array, each ball 12 in the ball grid array extending from a contact on the semiconductor die 10 to a corresponding contact on circuit board 1. It is appreciated that the structures and methods for forming the structures shown in FIGS. 16-18 may be the same as illustrated in the examples of FIGS. 1-15, with the exception of the use of balls 12 to electrically couple the semiconductor die 10 to a corresponding circuit board 1, 16.

In the examples of FIGS. 17-18, adhesive 6 is dispensed on circuit board 16 and CVDD-coated wires 18, 19 are placed in a location corresponding to the location of the identified hot-spots of semiconductor die 10 and circuit board 16 is flipped over and precisely aligned with circuit board 1 such that a portion of each CVDD-coated wire 18, 19 extends between a hot spot on the top surface of semiconductor die 10 and circuit board 16. Accordingly, in the board assembly of FIG. 17-18 a portion of each CVDD-coated wire 18, 19 extends between a hot-spot on the top surface of semiconductor die 10 and circuit board 16 and the layer of thermally conductive paste is in direct contact with a portion of each CVDD-coated wire 18, 19 and the top surface of semiconductor die 10.

In the multi-board assembly of FIG. 17, layer of thermally conductive paste includes regions 4, 5, 24, 25 of thermally conductive paste, with thermally conductive paste both underlying (4, 5) and overlying (24, 25) each identified hot-spot.

In the multi-board assembly of FIG. 18, layer of thermally conductive paste 27 overlies semiconductor die 10 with thermally conductive paste both underlying (4, 5) and overlying (27) each identified hot-spot.

Though the previous examples show CVDD-coated wires to extend past the edges of circuit board 1, in alternate embodiments one or more end of each CVDD-coated wire extends to a position near the edge of circuit board 1. In this embodiment heat sinks are used that partially overlap each circuit board 1, 16.

FIGS. 19-31 illustrate a method for forming a circuit board assembly in which, instead of attaching CVDD-coated wires to the top surface of the circuit board (step 102), slots are cut into the circuit board and the CVDD-coated wires are inserted into the slots.

Figure 19:
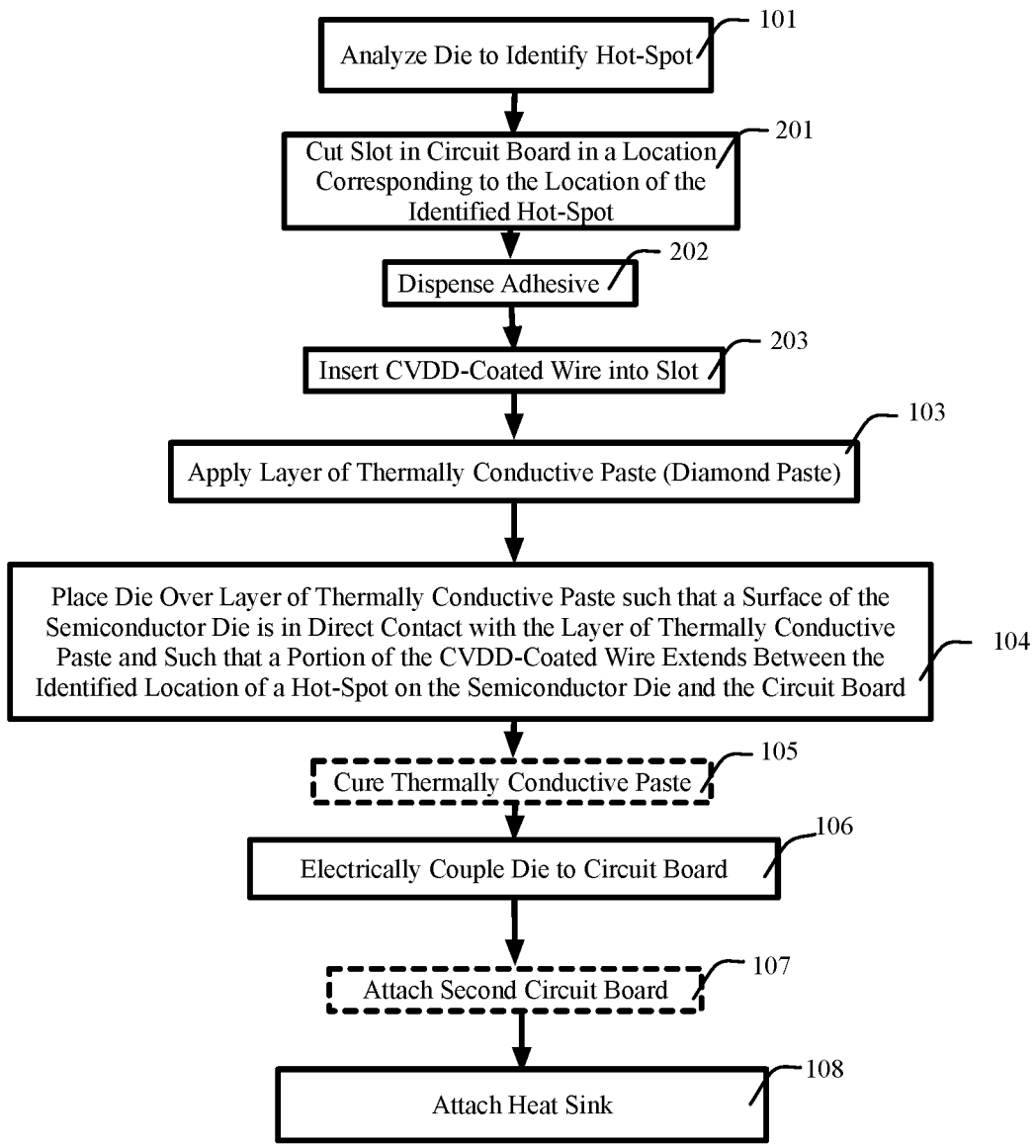
FIG. 19 is a block diagram illustrating a method for forming a board assembly having CVDD-coated wires for heat removal, where the CVDD-coated wires are disposed in slots, in accordance with an example of the invention.
Figure 20:
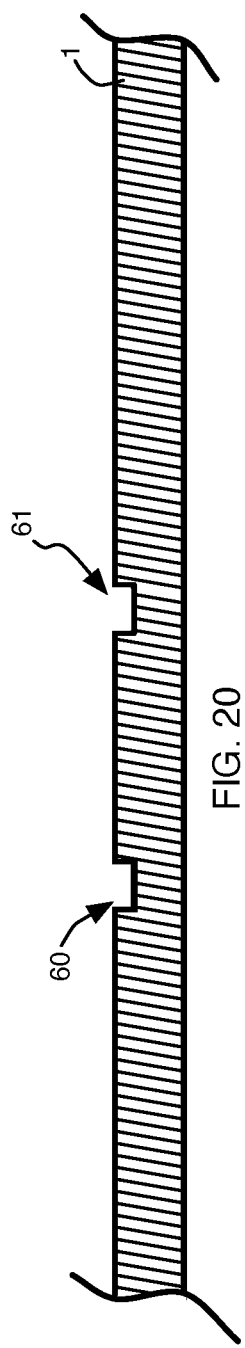
FIG. 20 is a diagram showing a front cross-sectional view of a circuit board with slots cut into the circuit board in locations corresponding to identified hot spots in accordance with an example of the invention.
Figure 21:
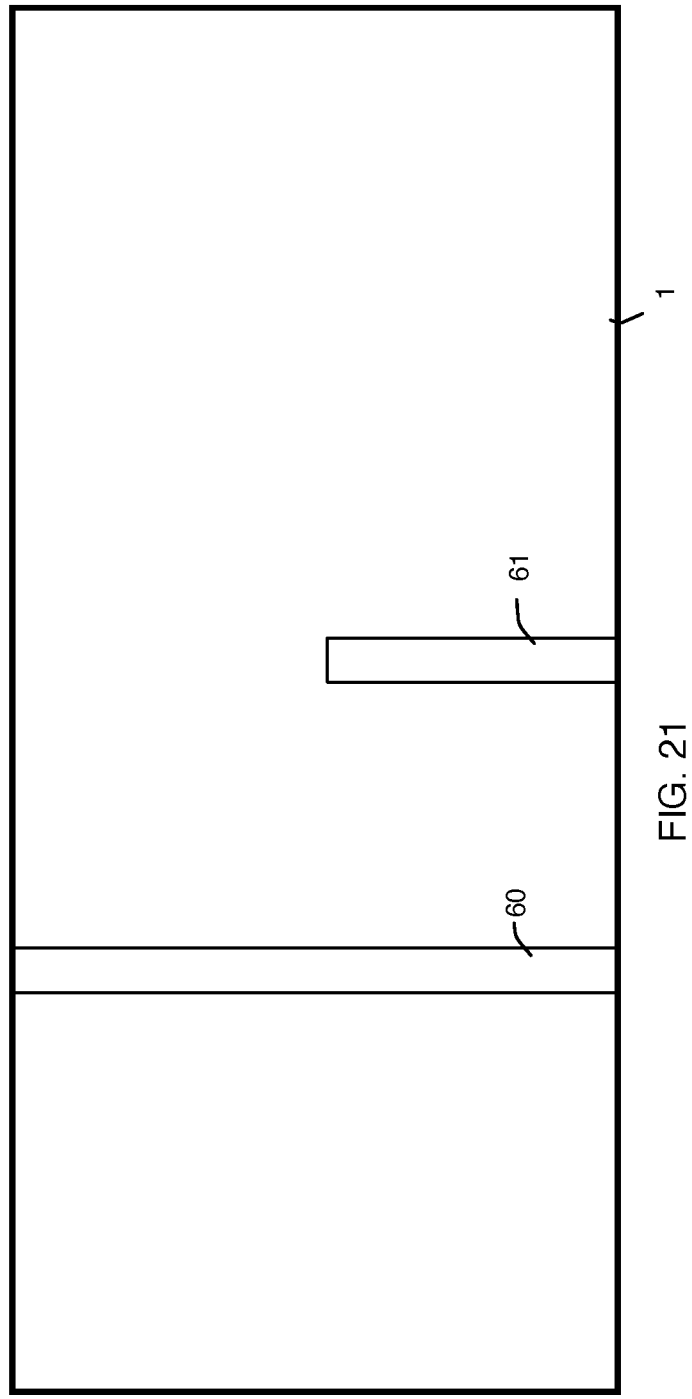
FIG. 21 is a diagram showing a top view of the circuit board of FIG. 20 in accordance with an example of the invention.

Referring now to method 200 of FIG. 19, as described above in relation to method 100, a location of a hot-spot on a semiconductor die is identified (101). A slot is cut (201) in the circuit board in a location corresponding to the location of the identified hot-spot. The slot may be cut into the top surface 63 of circuit board 1 using a laser or a router (e.g., a cutting device that uses a rotary blade). FIGS. 20-26 illustrate slot 60 that is cut so as to have a location on circuit board 1 corresponding to the location of hot-spot 14 on semiconductor die 10 and slot 61 that is cut so as to have a location on circuit board 1 corresponding to the location of hot-spot 15 on semiconductor die 10. The location of slots 60-61 may be determined by identifying where the identified hot-spots are in relationship to an alignment indicator on semiconductor die 10, precisely establishing the location on circuit board 1 where semiconductor die 10 will be attached, determining where the alignment indicator will be positioned on circuit board 1 and using the position of the hot spots relative to the alignment indicator to determine where slots 60-61 need to be cut.

Figure 22:
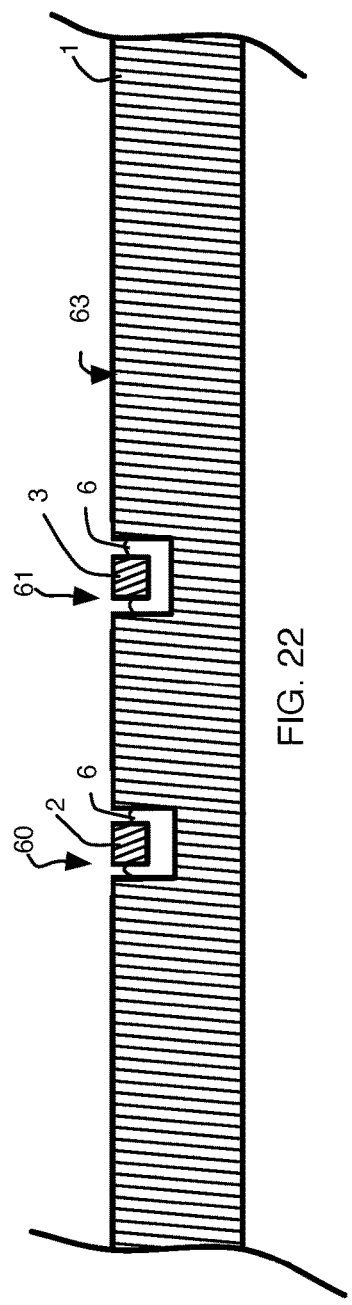
FIG. 22 is a diagram showing a front cross-sectional view of the circuit board assembly of FIG. 21 after the CVDD-coated wires have been inserted into the slots in the circuit board in accordance with an example of the invention.
Figure 23:
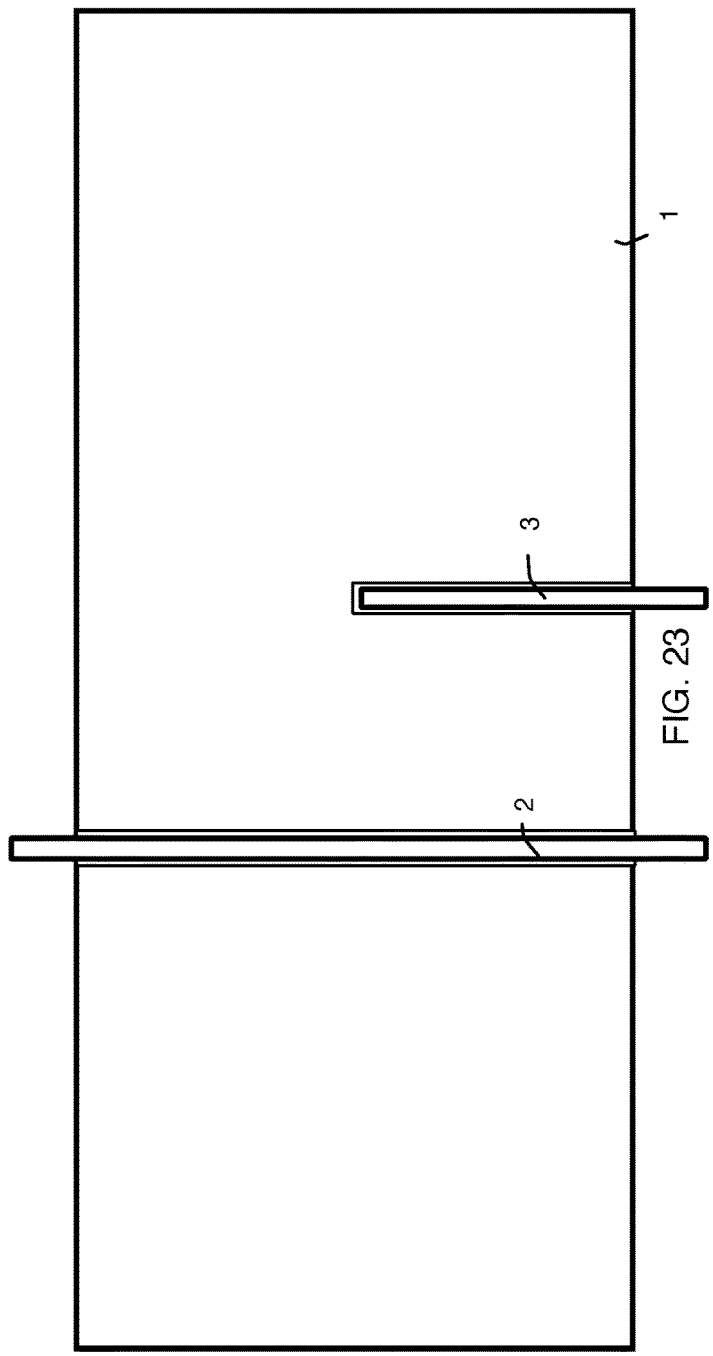
FIG. 23 is a diagram showing a top view of the circuit board assembly of FIG. 22 in accordance with an example of the invention.

Adhesive is dispensed (202). Referring now to FIG. 22, adhesive 61 is dispensed within the slots 60, 61.

A CVDD-coated wire is inserted (104) into the slot. In the example shown in FIGS. 22-23, CVDD-coated wires 2, 3 are inserted into slots 60-61. A pick-and-place device may be used to precisely position the CVDD-coated wires 2, 3 within each slot 60-61. The width of each CVDD-coated wire 2, 3 will be less than the size of the corresponding slot 60, 61 into which it is placed so that it will fit into the slot.

Adhesive 6 may be dispensed within the slots 60, 61 prior to inserting CVDD-coated wires 2, 3 into slots 60, 61. Alternatively, adhesive 61 is dispensed onto CVDD-coated wires 2, 3 prior to inserting them into slots 60, 61.

Optionally, the adhesive may be cured to make sure that CVDD-coated wires 2, 3 remain in their slots 60-61 during subsequent process steps.

Figure 29:
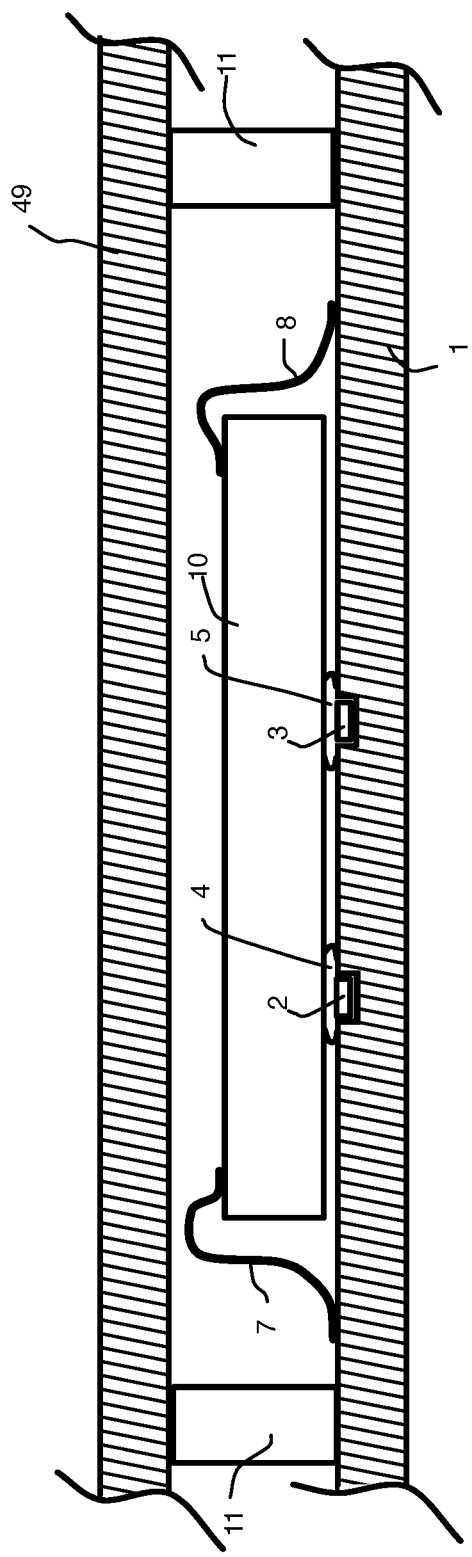
FIG. 29 is a diagram showing a front cross-sectional view of a circuit board assembly that includes two circuit boards and in which leads are used to couple the semiconductor die to the circuit board, in accordance with an example of the invention.
Figure 30:
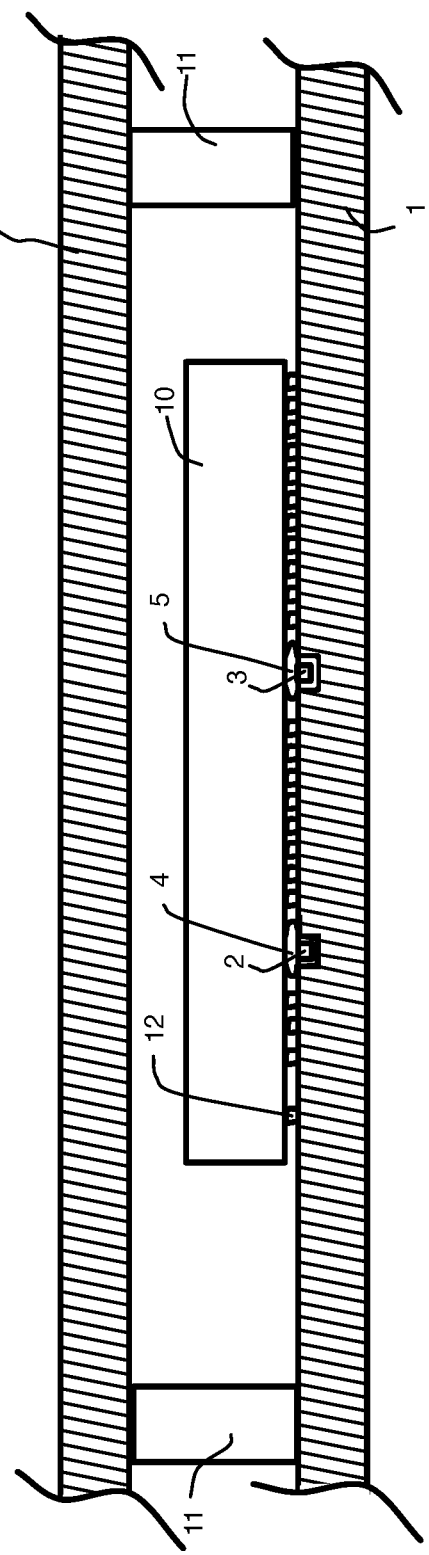
FIG. 30 is a diagram showing a front cross-sectional view of a circuit board assembly that includes two circuit boards and in which a ball grid array is used to couple the semiconductor die to the circuit board, in accordance with an example of the invention.

The method then proceeds in the same manner, and uses the same materials and structures as discussed in the examples of FIGS. 1-18. More particularly, a layer of thermally conductive paste 4, 5 is applied (103) over the respective CVDD-coated wire 2, 3 as shown in FIG. 24, the semiconductor die 10 is placed (104) over the thermally conductive paste 4, 5 as shown in FIG. 25. The thermally conductive paste 4, 5 may be applied over each CVDD-coated wire 2, 3 at the location of each identified hot-spot 14, 15 as illustrated in FIGS. 24-27 or may be more extensive (e.g., having a lateral extent such as that shown in FIGS. 13-14). Optionally, the thermally conductive paste is cured (105). FIG. 27 illustrates the use of leads 8 in step 106, and FIG. 28 illustrates the use of a ball grid array comprising balls 12 in step 106 for coupling semiconductor die 10 to circuit board 1. FIG. 29 illustrates a multi-board assembly that includes leads 8 for coupling semiconductor die 10 to circuit board 1 and a second circuit board 49 that overlies circuit board 1 of optional step 107. FIG. 30 illustrates a multi-board assembly that uses a ball grid array for coupling semiconductor die 10 to circuit board 1, such that semiconductor die 10 extends between circuit board 1 and circuit board 49.

In step 108, one or more heat sink is coupled (e.g., attached), to the CVDD-coated wire, as described above in relation to FIGS. 9A, 9B, 10.

CVDD-coated wires 2, 3, 18, 19 may have a rectangular cross-sectional shape as shown in the previous FIGS. However, alternatively, CVDD-coated wires may have a round or rounded cross-sectional shape. In the example shown in FIG. 31, CVDD-coated wires 82, 92 are shown having a round shape.

Figure 31:
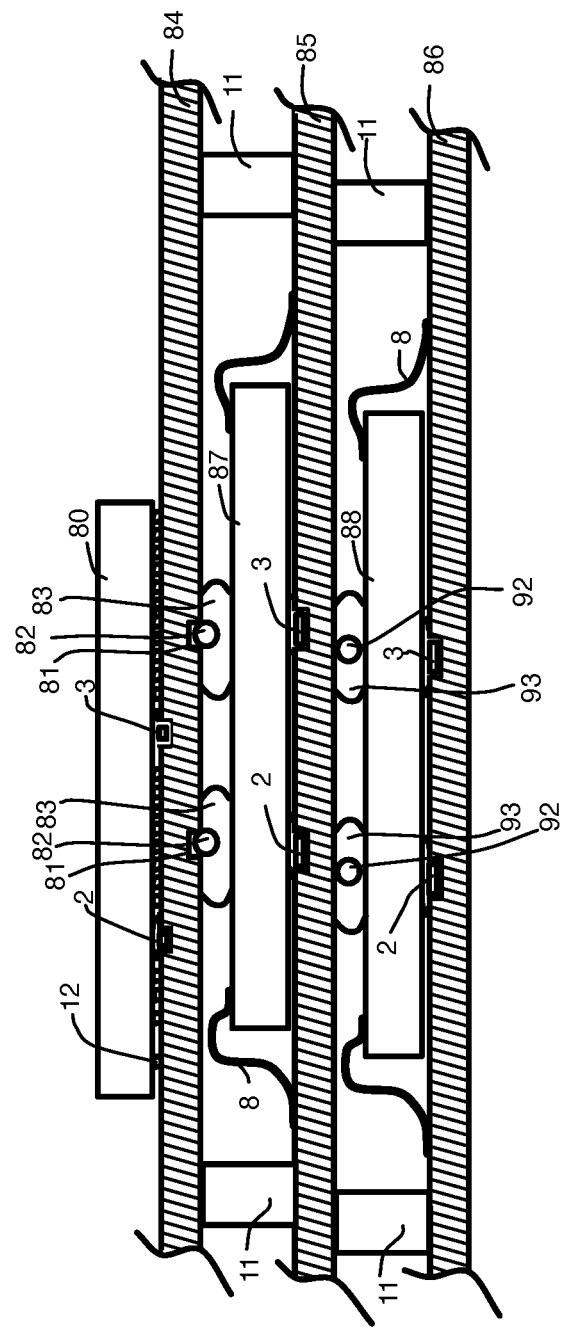
FIG. 31 is a diagram showing a front cross-sectional view of a circuit board assembly that includes three circuit boards, in accordance with an example of the invention.

In the example shown in FIG. 31, CVDD-coated wires 82 are inserted into slots 81 on circuit board 84. In this example rounded CVDD-coated wires 82 are larger than slots 81 such that they only partially fill slots 81. However, alternatively, slots 81 could be dimensioned such that CVDD-coated wires are disposed entirely within slots 81. In this example, thermally conductive paste 83 is applied before attaching circuit board 84 to circuit board 85 and semiconductor die 87. CVDD-coated wires extend both above (92) and below (2, 3) each hot-spot on semiconductor die 88. Thermally conductive paste 93 is in direct contact with the top surface of semiconductor die 88 and with CVDD-coated wires 92. Also, CVDD-coated wires extend both above (82) and below (2, 3) each hot-spot on semiconductor die 87. Thermally conductive paste 83 is in direct contact with the top surface of semiconductor die 87 and with CVDD-coated wires 82. Semiconductor die 80 is coupled to semiconductor die 84 by solder balls 12. Standoff structures 11 are used to attach semiconductor die 84 to semiconductor die 85 and to attach semiconductor die 85 to semiconductor die 86.

CVDD-coated wires are shown in FIGS. 2-18 and 20-31 to be relatively straight. However, alternatively, CVDD-coated wires 2 may have a shape that is curved. When the wire needs to be shaped to form the desired curve, the shaping is done prior to coating the wire with CVDD.

Figure 32:
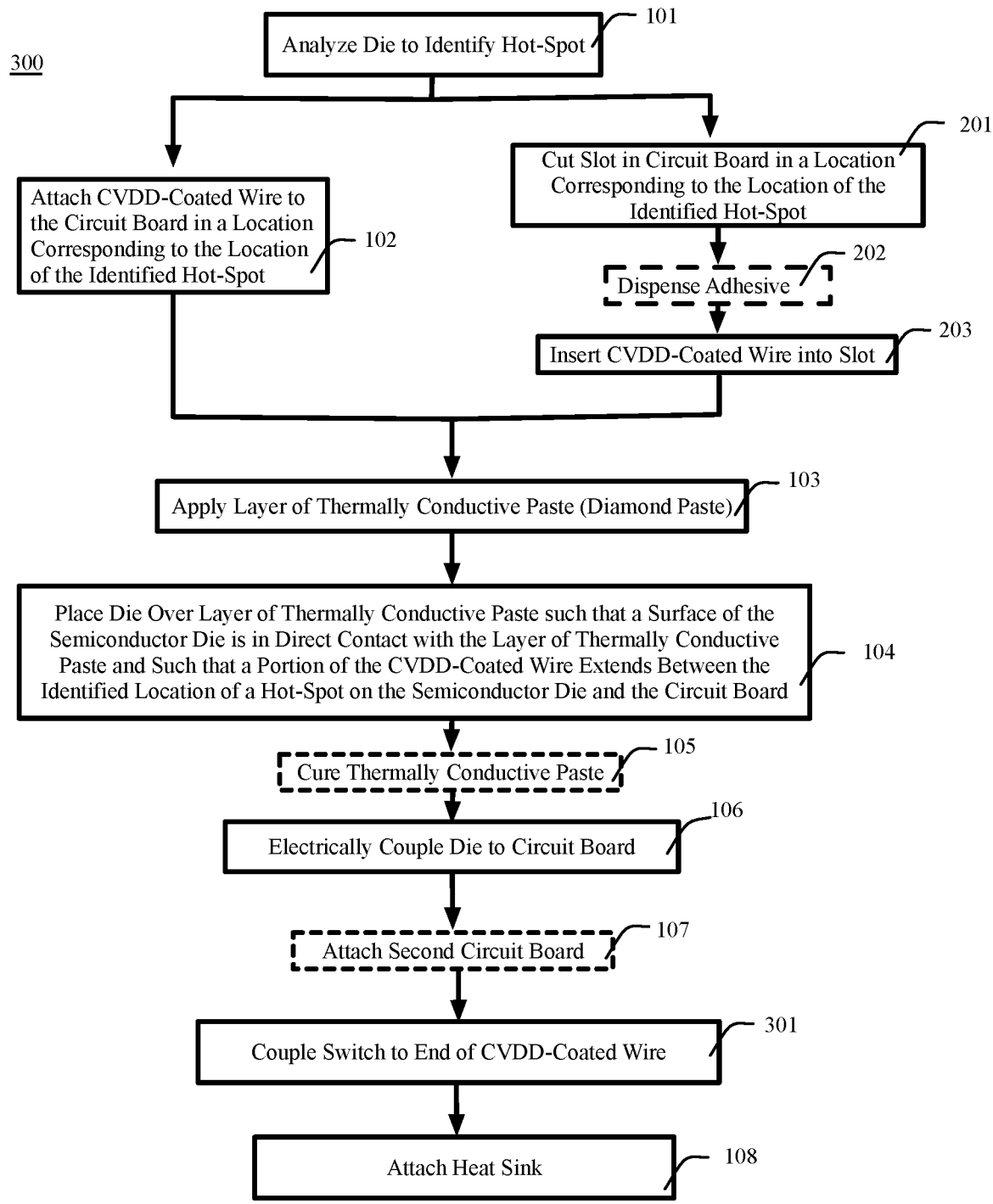
FIG. 32 is a diagram illustrating a method for forming a circuit board assembly in which CVDD-coated wires are used for both cooling the semiconductor die and heating the semiconductor die in accordance with an example of the invention.

FIG. 32 illustrates a method 300 for forming a circuit board assembly. The die is analyzed (101) to identify hot spot(s). Either the CVDD-coated wires are attached to a circuit board (step 102); or one or more slot is cut (201) in the circuit board, adhesive is dispensed (202) and a CVDD-coated wire is inserted into the slot (203). Steps 103-107 are then performed in the same manner as discussed with reference to the previous figures and may utilize the same materials.

A switch is coupled (301) to at least one end of the CVDD-coated wire, the switch coupled to a power source and operable for passing a current through CVDD-coated wire to warm-up the semiconductor die 10. In the example shown in FIG. 33 switch 71 is coupled between a power source (not shown) and one end of CVDD-coated wire 2. The other end of CVDD-coated wire 2 is coupled to ground. In the example shown in FIG. 33 switch 71 is coupled to a power source, and couples to one end of CVDD-coated wire 2. More particularly, contact 74 near an edge of circuit board 1 is coupled to ground. One end of wire 76 is attached (e.g., soldered) to contact 74 and the other end of wire 76 is electrically coupled (e.g., soldered) to one end of CVDD-coated wire 2. Trace 73 couples switch 71 to contact 75 near an opposite edge of circuit board 1. Wire 77 is attached on one end (e.g., soldered) to contact 75 and the other end is electrically coupled (e.g., soldered) to the other end of CVDD-coated wire 2. Switch 71 may be coupled to the CVDD-coated wire either before or after the heat sink is attached in step 108.

Figure 33:
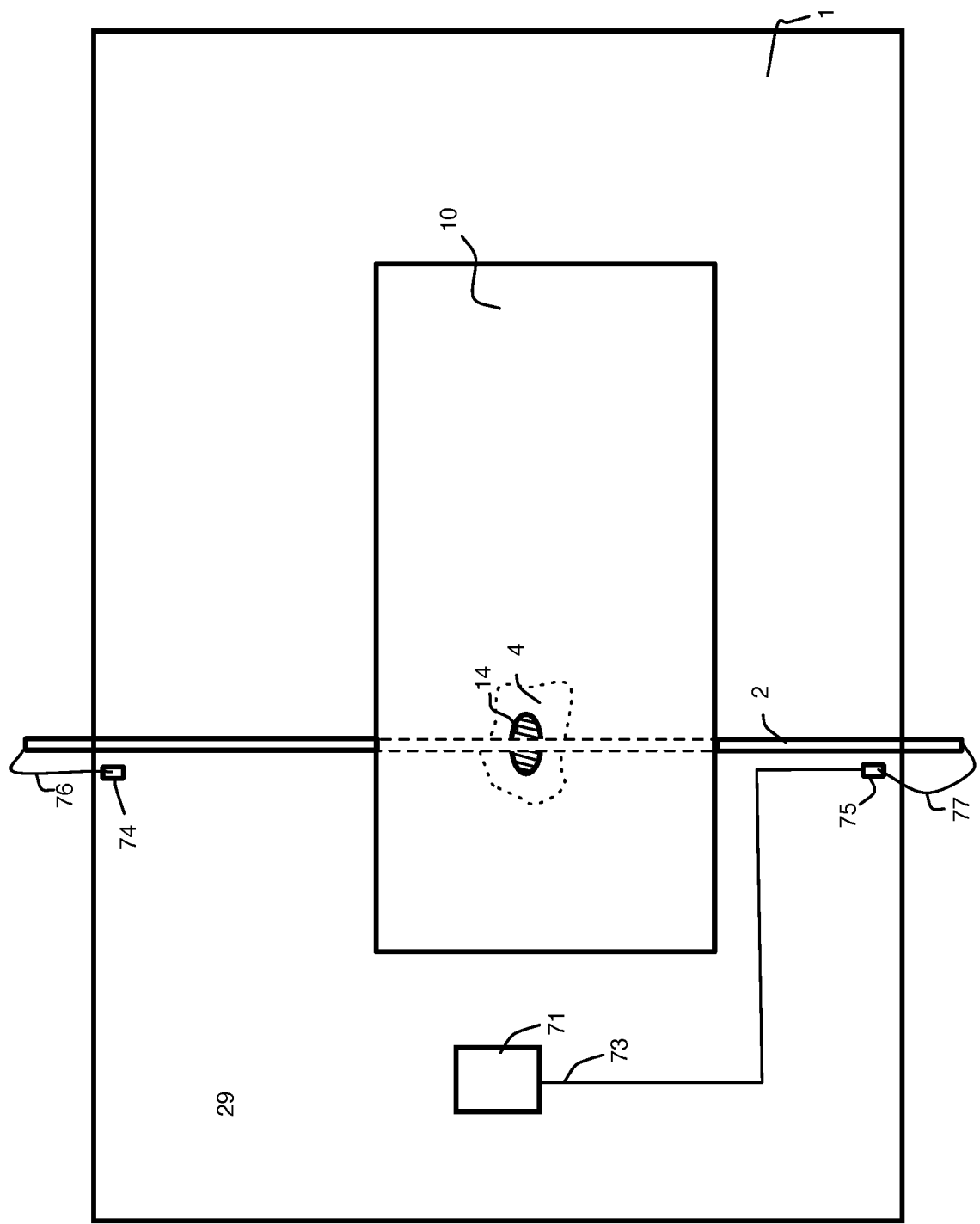
FIG. 33 is a diagram showing a top view of a circuit board assembly, and illustrates an example in which a CVDD-coated wire is used to both heat the circuit board and conduct heat away from the semiconductor die in accordance with an example of the invention.

It is appreciated that the structure of FIG. 33 is exemplary, and that other mechanisms could be used for coupling the ends of CVDD-coated wire 2 to a power source, such mechanisms may include connectors, connector receptacles, and receptacles that receive the ends of CVDD-coated wire 2, without limitation.

Figure 34:
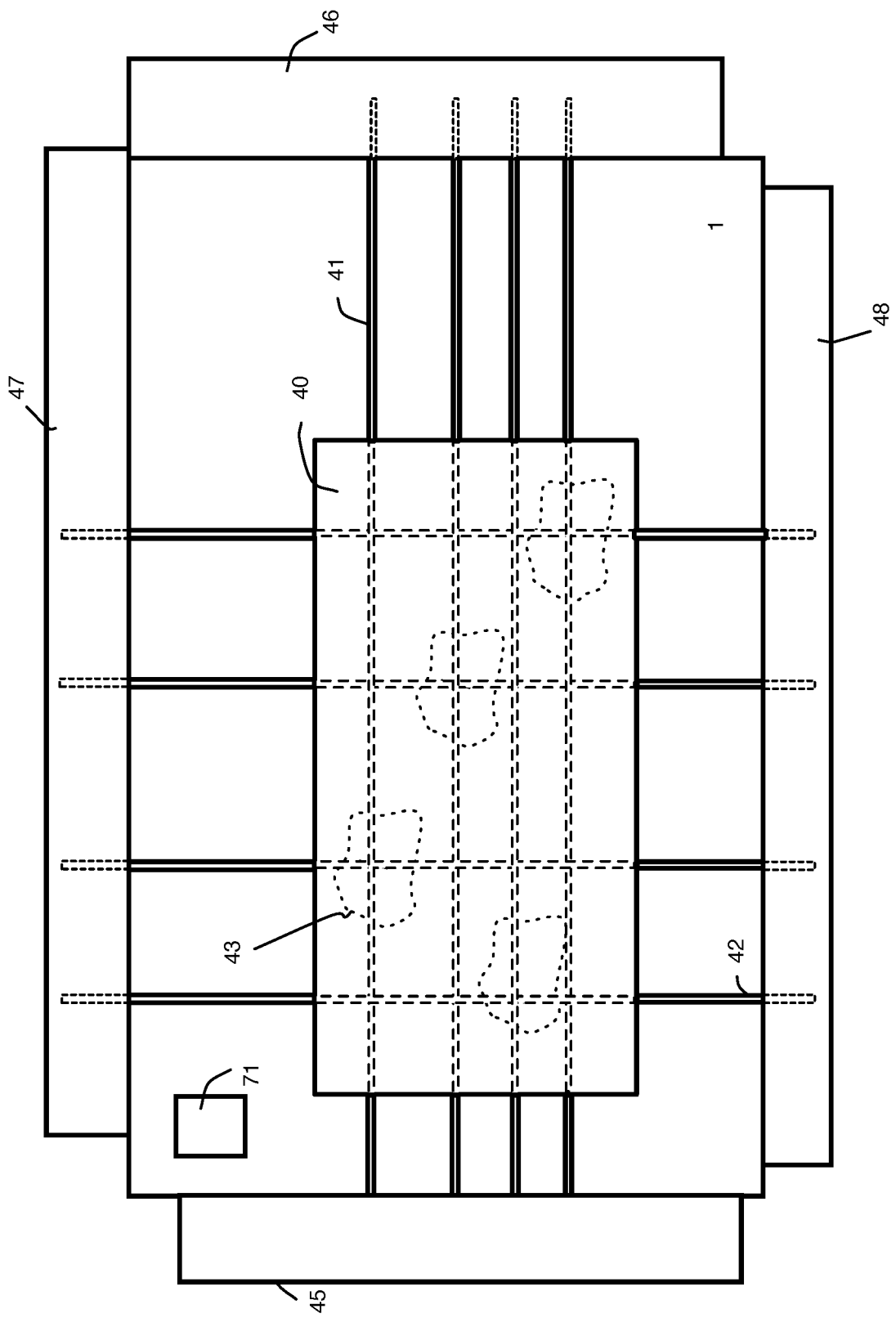
FIG. 34 is a diagram showing a top view of a circuit board assembly, and illustrates an example in which a CVDD-coated wire is used to both heat the circuit board and conduct heat away from the semiconductor die in accordance with an example of the invention.
Figure 35:
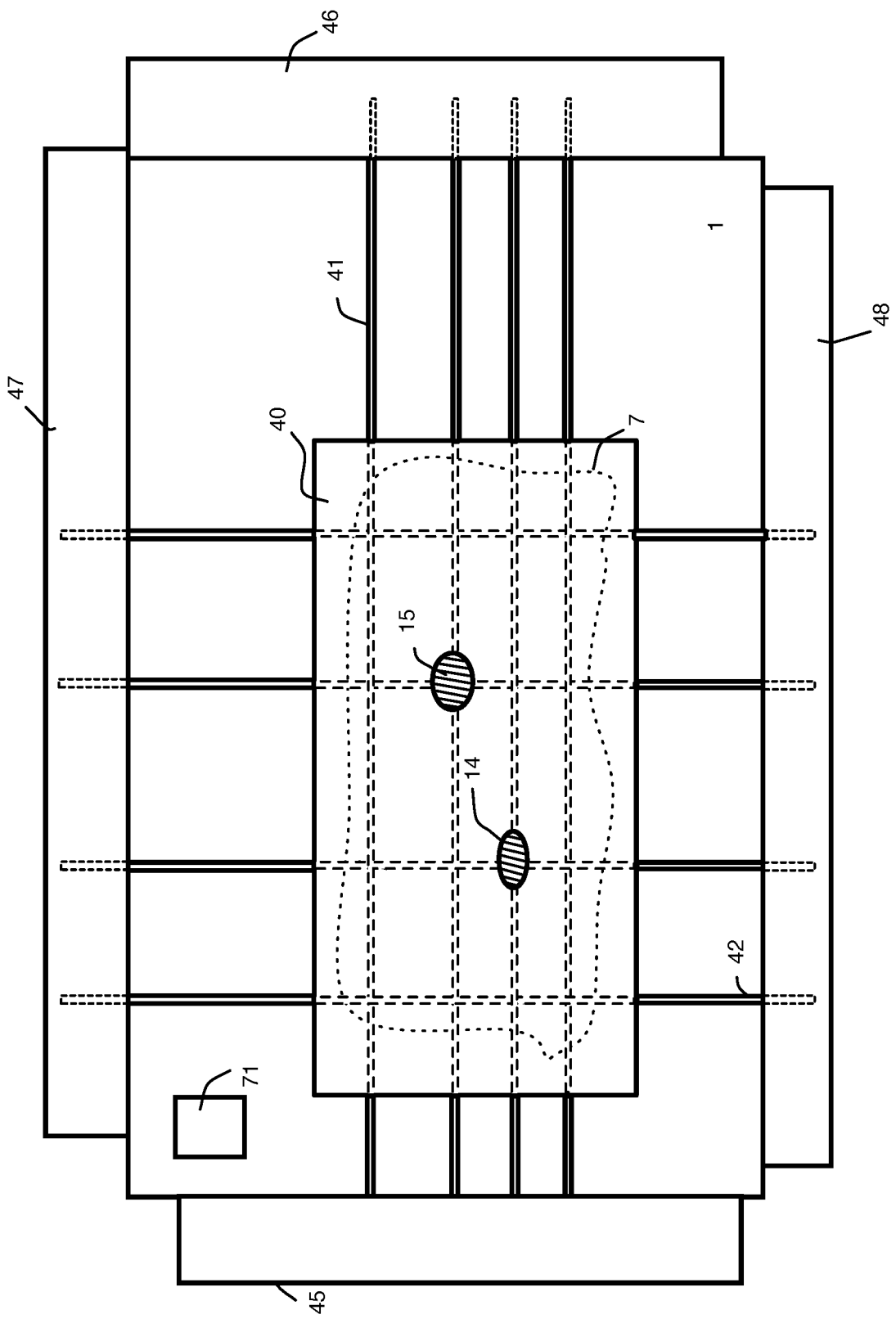
FIG. 35 is a diagram showing a top view of a circuit board assembly, and illustrates an example in which a CVDD-coated wire is used to both heat the circuit board and conduct heat away from the semiconductor die in accordance with an example of the invention.

FIG. 34 shows a mesh of CVDD-coated wires 41, 42 that cross at regions of thermally conductive paste 43. In one example, one or more switch 71 couples to the ends of each CVDD-coated wire 41, 42 for passing current through each CVDD-coated wire 41, 42. The mesh of CVDD-coated wires 41, 42 are effective for both conveying heat away from semiconductor die 40 during operation and for heating semiconductor die 40, such as during startup. Heat sinks 45-48 may have the two-plate structure shown in FIG. 9B, allowing for easily coupling of the ends of CVDD-coated wires 41, 42 to the one or more switch 71. The circuit board assembly may include multiple regions of thermally conductive paste 43 as shown in FIG. 34, each of which is above or below an identified hot-spot (not shown) or may include a broader region of thermally conductive paste 7 that conveys heat from more than one hot-spot 14, 15 as is illustrated in FIG. 35.

One use of this heating capability is for 'cold start' heaters. More particularly, during initial operation of the board assembly, current is passed down CVDD-coated wires 41, 42 to warm the boards/components up, so they get into their safe optimal operating temperature range. When semiconductor die 40 reaches the desired temperature, or after a predetermined amount of time, the heating process is stopped and the CVDD-coated wires are exclusively used for cooling the semiconductor die 40.

In one specific example, the board assembly is control electronics for an automotive battery pack. Because of the highly integrated nature of automotive battery pack assemblies, and because the control electronics are close to the batteries in these assemblies, the methods and apparatus of the present invention are effectively utilized for both warm-up and cooling.

In addition to the other advantages discussed above, the method and apparatus of the present invention adds very little weight to the board assembly compared to conventional copper plate heatsinks. Also, by moving the heatsink off the circuit board 1 to adjacent locations as shown in FIGS. 34, 35, some of the physical stresses caused by acceleration on the circuit board are alleviated. Moreover, the stiffening of the CVDD deposition process stiffens the laminated board, thereby reducing the flexural cracking of the circuit board assembly. Thereby, these board assemblies may be used in harsh environments, such as high vibration or hot environments.

While examples and applications of this invention have been shown and described, it would be apparent to those skilled in the art that many more modifications than mentioned above are possible without departing from the inventive concepts herein. The invention, therefore, is not to be restricted except in the spirit of the appended claims

What is claimed is:

1. A method for forming a board assembly comprising:
   identifying a location of a hot-spot on the semiconductor die;
   attaching a first Chemical Vapor Deposition Diamond (CVDD) coated wire to a first circuit board in a location corresponding to the location of the identified hot-spot;
   applying a layer of thermally conductive paste over the first CVDD-coated wire; and
   placing a semiconductor die over the layer of thermally conductive paste such that a surface of the semiconductor die is in direct contact with the layer of thermally conductive paste and such that a portion of the first CVDD-coated wire extends between the identified location of the hot-spot on the semiconductor die and the first circuit board.

2. The method of claim 1 further comprising:
   cutting a first slot in the circuit board in a location corresponding to the location of the identified hot-spot,
   wherein the attaching a first CVDD-coated wire includes inserting the first CVD-coated wire into the first slot.

3. The method of claim 1 further comprising:
   cutting a first slot in the circuit board in a location corresponding to the location of the identified hot-spot; and
   dispensing adhesive within the first slot, and
   wherein the attaching the first CVDD-coated wire includes inserting the first CVD-coated wire into the first slot.

4. The method of claim 2 further comprising:
   cutting a second slot in the circuit board in a location corresponding to the location of the identified hot-spot; and
   inserting a second CVDD-coated wire into the second slot, the second CVDD-coated wire crossing the first CVDD-coated wire,
   wherein the layer of thermally conductive paste is in direct contact with a portion of the second CVDD-coated wire, and
   wherein a portion of the second CVDD-coated wire extends between the hot-spot and the first circuit board.

5. The method of claim 1 further comprising coupling one or more heat sink to the first CVDD-coated wire.

6. The method of claim 1 further comprising coupling a switch to one end of the first CVDD-coated wire and coupling the other end of the first CVDD-coated wire to ground, the switch operable for passing a current through the first CVDD-coated wire to warm-up the semiconductor die.

7. The method of claim 1 wherein a first end of the first CVDD-coated wire extends past the edge of the circuit board.

8. The method of claim 1 wherein both ends of the first CVDD-coated wire extend past the edge of the circuit board.

9. The method of claim 1 further comprising:
   coupling a heat sink to the first CVDD-coated wire, the heat sink including a top plate that directly overlies and is in contact with a portion of the first CVDD-coated wire that extends past an edge of the circuit board, the heat sink including a bottom plate that is coupled to the top plate, the bottom plate directly underlying and in contact with the portion of the first-CVDD-coated wire that extends past the edge of the circuit board.

10. The method of claim 1 further comprising coupling a second circuit board to the first circuit board such that the semiconductor die extends between the first circuit board and the second circuit board.

11. The method of claim 1 wherein the thermally conductive paste comprises diamond paste.

12. The method of claim 1 wherein the first CVDD-coated wire comprises tungsten.

13. The method of claim 1 wherein more than ninety percent of the layer of thermally conductive paste is CVDD particles having a size of less than 0.5 microns, and the remaining portion of the thermally conductive paste comprises a thermally conductive material.

14. A board assembly comprising:
a first circuit board;
a semiconductor die electrically coupled to the first circuit board;
a first Chemical Vapor Deposition Diamond (CVDD) coated wire, a portion of the first CVDD-coated wire extending between a hot-spot on the semiconductor die and the first circuit board; and
a layer of thermally conductive paste disposed between the hot-spot on the semiconductor die and the first circuit board, the layer of thermally conductive paste in direct contact with a portion of the CVDD-coated wire.

15. The board assembly of claim 14 wherein the first circuit board includes a first slot, the CVDD-coated wire extending within the first slot.

16. The board assembly of claim 15 further comprising:
a second CVDD-coated wire extending within a second slot in the first circuit board, the second CVDD-coated wire crossing the first CVDD-coated wire, a portion of the second CVDD-coated wire extending between the hot-spot and the first circuit board,
wherein the layer of thermally conductive paste is in direct contact with a portion of the second CVDD-coated wire where the second CVDD-coated wire crosses the first CVDD-coated wire.

17. The board assembly of claim 14 further comprising a heat sink coupled to the first CVDD-coated wire.

18. The board assembly of claim 14 further comprising a switch coupled to one end of the first CVDD-coated wire, the switch operable for passing a current through the first CVDD-coated wire.

19. The board assembly of claim 14 wherein both ends of the first CVDD-coated wire extend past an edge of the first circuit board.

20. A board assembly comprising:
a first circuit board;
a second circuit board overlying the first circuit board;
a semiconductor die electrically coupled to the first circuit board and disposed between the first and second circuit board;
a first Chemical Vapor Deposition Diamond (CVDD) coated wire extending within a first slot in the first circuit board, a portion of the first CVDD-coated wire extending between a hot-spot on the semiconductor die and the first circuit board; and
a layer of thermally conductive paste disposed between the hot-spot on the semiconductor die and the first circuit board, the layer of thermally conductive paste in direct contact with a portion of the CVDD-coated wire; and
one or more heat sink coupled to the first CVDD-coated wire and to the first circuit board.

* * * * *